(12) United States Patent
Mikasa

(10) Patent No.: US 8,350,323 B2
(45) Date of Patent: Jan. 8, 2013

(54) SEMICONDUCTOR DEVICE

(75) Inventor: Noriaki Mikasa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/070,684

(22) Filed: Mar. 24, 2011

(65) Prior Publication Data

US 2011/0233662 A1    Sep. 29, 2011

(30) Foreign Application Priority Data

Mar. 26, 2010    (JP) ................. P2010-073287

(51) Int. Cl.
*H01L 29/76*    (2006.01)

(52) U.S. Cl. ........ 257/330; 257/301; 257/296; 438/268; 438/270; 438/389

(58) Field of Classification Search .............. 257/328, 257/213, 288, 327, E29.262; 438/268, 270
See application file for complete search history.

(56) References Cited

U.S. PATENT DOCUMENTS

| | | | | |
|---|---|---|---|---|
| 5,519,236 A | * | 5/1996 | Ozaki | 257/302 |
| 5,909,618 A | * | 6/1999 | Forbes et al. | 438/242 |
| 5,990,509 A | * | 11/1999 | Burns et al. | 257/296 |
| 6,426,526 B1 | * | 7/2002 | Divakaruni et al. | 257/302 |
| 6,537,871 B2 | * | 3/2003 | Forbes et al. | 438/243 |
| 6,800,898 B2 | * | 10/2004 | Cappelani et al. | 257/329 |
| 7,838,925 B2 | * | 11/2010 | Roesner et al. | 257/328 |
| 8,129,244 B2 | * | 3/2012 | Eun et al. | 438/268 |
| 2004/0033659 A1 | * | 2/2004 | Seitz et al. | 438/243 |
| 2008/0296671 A1 | | 12/2008 | Takaishi | |
| 2011/0129974 A1 | * | 6/2011 | Eun et al. | 438/268 |
| 2011/0129975 A1 | * | 6/2011 | Lee | 438/270 |

FOREIGN PATENT DOCUMENTS

JP    2009-10366 A    1/2009

* cited by examiner

*Primary Examiner* — Steven Loke
*Assistant Examiner* — David Goodwin
(74) *Attorney, Agent, or Firm* — McGinn IP Law Group, PLLC

(57) ABSTRACT

A semiconductor device may include, but is not limited to: a semiconductor substrate; a bit line; and a contact portion. The semiconductor substrate has a first groove having at least first and second side surfaces facing each other. The bit line is positioned in the first groove. The bit line is insulated from the semiconductor substrate. The contact portion is positioned in the first groove. The contact portion is electrically connected to the bit line. The contact portion contacts the first side surface of the first groove. The contact portion is insulated from the second side surface of the first groove.

4 Claims, 27 Drawing Sheets

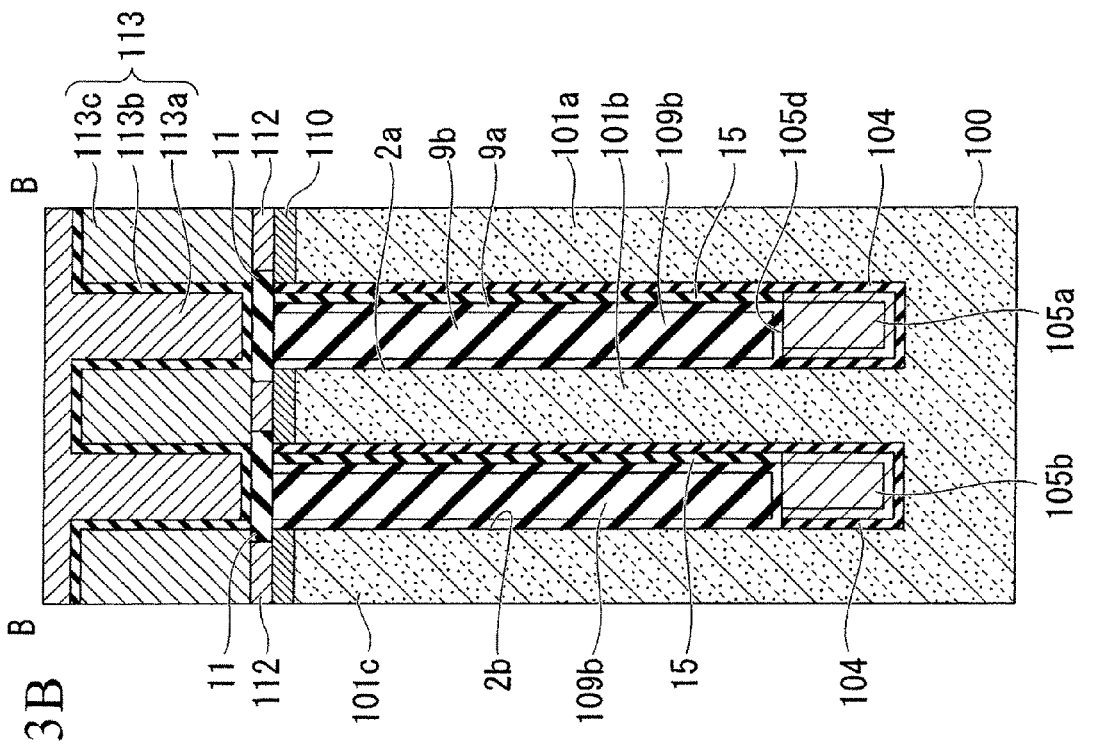
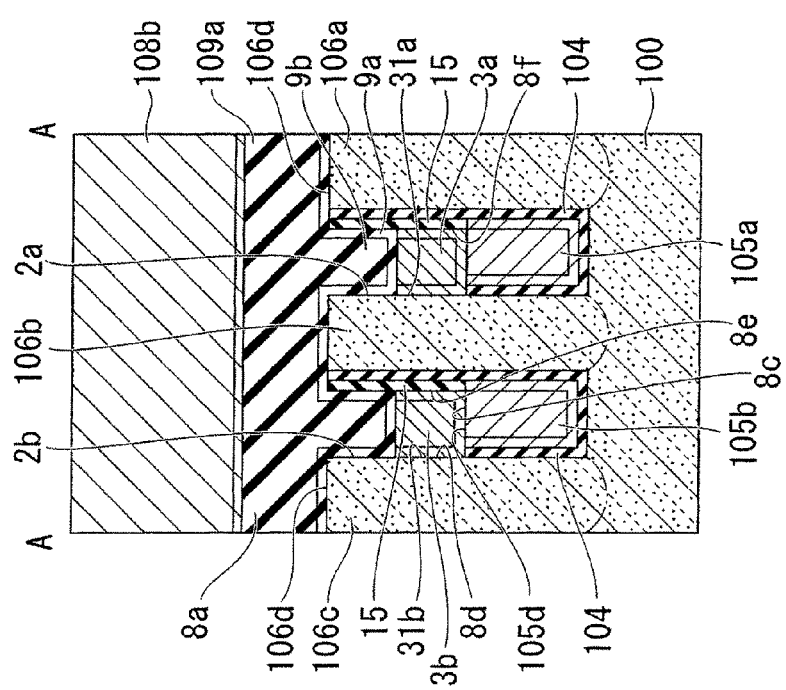

SEMICONDUCTOR DEVICE

BACKGROUND OF THE INVENTION

1. Field of the Invention

The present invention relates to a semiconductor device.

Priority is claimed on Japanese Patent Application No. 2010-073287, filed Mar. 26, 2010, the content of which is incorporated herein by reference.

2. Description of the Related Art

Recently, with miniaturization of semiconductor devices, the plane area of semiconductor elements and regions in which transistors are formed (active regions) have been decreased. Regarding planar transistors, the channel length and width have been decreased with a decrease in the size of the active regions, and thereby the short channel effect and the like have been problematic.

For this reason, in lieu of planar transistors, semiconductor devices including vertical transistors, which achieve a sufficient channel length and width even in a miniaturized region, have been proposed.

Different from the planar transistor, the vertical transistor includes a pillar extending in a direction perpendicular to a main surface of the semiconductor substrate. In the on-state, a channel is formed along the pillar in a direction perpendicular to the main surface of the semiconductor substrate. Accordingly, the vertical transistor is more effectively applicable to a miniaturized semiconductor memory element, such as a DRAM, than the planar transistor.

A buried bit line is connected to a source and/or drain (S/D) region of a vertical transistor included in a semiconductor device. There is a buried bit line buried in a trench, an inner surface of which is covered by an insulating film. The buried bit line is connected to a diffusion layer, which forms an S/D region of a transistor, via a contact portion made of a conductive material, which is provided adjacent to a sidewall of the trench.

As a method of forming such a buried bit line, for example, a bit line trench, which extends in an extending direction of a bit line, is formed in a silicon substrate. Then, a silicon oxide film is formed so as to cover a side surface of the bit line trench that exposes the silicon substrate. Then, one of the side surfaces of the bit line trench is exposed. Then, a bottom portion of the bit line trench is filled with a material for forming a bit line. Thus, a bit line, which contacts the exposed portion of the silicon substrate, is formed. Then, a thermal treatment is carried out to diffuse an impurity from the bit line toward the exposed silicon substrate. Thus, a diffusion layer, which will become an S/D region, is formed (see, for example, Japanese Patent Laid-Open Publication No. 2009-10366).

However, regarding the semiconductor device of the related art, which includes the buried bit line contacting the lower diffusion layer, a variation of a capacitance value of the lower diffusion layer is large, and thereby the reliability of the semiconductor device is insufficient.

Hereinafter, problems of the semiconductor device of the related art are explained with accompanying drawings. FIG. 22 is a cross-sectional view illustrating part of a semiconductor memory device, such as a DRAM (Dynamic Random Access Memory), which is an example of the semiconductor device of the related art. FIGS. 23 to 30 are cross-sectional views illustrating a process flow indicative of a method of the related art for manufacturing the DRAM shown in FIG. 22. FIG. 31 is a plan view illustrating one process included in the method of the related art for manufacturing the DRAM shown in FIG. 22.

Regarding the semiconductor memory device of the related art, which is shown in FIG. 22, trenches 202a and 202b are formed in a semiconductor substrate 200 made of silicon. Thus, silicon pillars 203a, 203b, and 203c are defined by the trenches 202a and 202b. The silicon pillars 203a, 203b, and 203c become channels of a transistor.

A pair of gate electrodes 208a and 208b is buried so as to cover both side surfaces of the silicon pillar 203a. Similarly, a pair of gate electrodes 208c and 208d is buried so as to cover both side surfaces of the adjacent silicon pillar 203b. The gate electrodes 208a, 208b, 208c, and 208d function as word lines.

An insulating film 204, which is made of a thermal oxide film, is formed so as to cover inner surfaces of bottom portions 201a and 201b of the trenches 202a and 202b. Buried bit lines 205a and 205b are formed over the insulating film 204 so as to fill the bottom portions 201a and 201b. The extending direction of the bit lines 205a and 205b is perpendicular to the extending direction of the word lines (the gate electrodes 208a, 208b, 208c, and 208d shown in FIG. 22). The buried bit lines 205a and 205b are connected to lower diffusion layers 206a and 206b via contact portions 13a and 13b, respectively. The lower diffusion layers 206a and 206b are S/D regions of a transistor.

Upper diffusion layers 210 are formed in upper surface regions of the silicon pillars 203a, 203b, and 203c. The upper diffusion layers 210 are other S/D regions. Contact plugs 212 are formed over the upper diffusion layers 210. A capacitor 213 is formed over the contact plugs 212. The capacitor 213 includes a lower electrode 213a, a capacitor insulating film 213b, and an upper electrode 213c. The silicon pillars 203a, 203b, and 203c are isolated from one another by an inter-layer insulating film 209. The contact plugs 212 are isolated from one another by an inter-layer insulating film 211.

Regarding the silicon pillar 203b, one transistor is formed, which includes: the lower diffusion layer 206b connected to the bit line 205b; a pair of the gate electrodes 208c and 208d covering side surfaces of the silicon pillar 203b via a gate insulating film (not shown in FIG. 22); and the upper diffusion layer 210 connected to the capacitor 213.

Hereinafter, a method of manufacturing the semiconductor memory device shown in FIG. 22 is explained with reference to FIGS. 23 to 31. Firstly, a silicon nitride film 140 is formed over a semiconductor substrate 200 made of silicon. Then, holes 105c are formed in the silicon nitride film 140 by photolithography and dry-etching processes so as to partially expose an upper surface of the semiconductor substrate 200, as shown in FIG. 23.

Then, the semiconductor substrate 200 is anisotropically dry-etched with the silicon nitride film 140 as a mask to form the trenches 202a and 202b. Then, the insulating film 204, which is made of a thermal oxide film, is formed so as to cover inner surfaces of the trenches 202a and 202b, as shown in FIG. 24.

Then, a poly-silicon film 111 is formed over the insulating film 204 by a CVD (Chemical Vapor Deposition) method so as to fill the trenches 202a and 202b, as shown in FIG. 25. Then, the poly-silicon film 111 is dry-etched so that the top level of the poly-silicon film 111 becomes equal to the top level of the contact portions 13a and 13b (see FIG. 22).

Then, a sidewall 115, which has a different etching rate from that of the insulating film 204, is formed so as to cover portions of the insulating film 204 which cover the side surfaces of the trenches 202a and 202b. Then, the poly-silicon film 111 is dry-etched so that the top level of the poly-silicon film 111 becomes equal to the bottom level of the contact portions 13a and 13b (see FIG. 22), as shown in FIG. 26.

Then, a mask, which has a different etching rate from that of the insulating film 204, is formed so as to cover the sidewall 115 excluding a lower portion of the sidewall 115 which is positioned at the formation region of the contact portion 13a (13b). Then, the insulating film 204 is wet-etched with the mask. Thus, a hole 100a, which exposes part of the semiconductor substrate 200, is formed in the insulating film 204, as shown in FIG. 26.

Before the wet-etching process to form the hole 100a in the insulating film 204, a lithography process is carried out in order to cover contact portions 202aa and 202bb for pulling up bit lines with a photoresist film. The contact portions 202aa and 202bb are positioned at end portions of the bit line trenches 202a and 202b, as shown in FIG. 31.

If the holes 100a are formed also in portions of the insulating film 204 which cover the contact portions 202aa and 202bb, diffusion layers are formed adjacent to the contact portions 202aa and 202bb in a later process. Thereby, short-circuit occurs between adjacent bit lines. To prevent this problem, diffusion layers are prevented from being formed adjacent to the contact portions 202aa and 202bb. In other words, a lithography process is carried out, in which a photoresist film is formed so as to cover a memory cell region excluding a region in which a pillar transistor is formed. Thus, an opening pattern 202c is formed. Then, the hole 100a is formed in the insulating film 204 with the photoresist film having the opening pattern 202c. Then, the photoresist film is removed after the hole 100a is formed.

After the hole 100a is formed, the sidewall 115 is removed. Then, a poly-silicon film 117, which contains an impurity, such as arsenic or phosphorus, is formed over the silicon nitride film 140 by the CVD method so as to fill the trenches 202a and 202b, as shown in FIG. 27. Then, the poly-silicon film 117 is dry-etched so that only a portion of the poly-silicon film 117 which covers the hole 100a remains, and other portions of the poly-silicon film 117 are removed. Thus, the contact portions 13a and 13b are formed, as shown in FIG. 28.

Then, a conductive film 120, which is made of a conductive material, is formed by the CVD method over the silicon nitride film 140 so as to fill the trenches 202a and 202b, as shown in FIG. 29. Then, a thermal treatment process is carried out to diffuse an impurity included in the contact portions 13a and 13b into the semiconductor substrate 200. Thus, the lower diffusion layers 206a and 206b are formed.

Then, the conductive film 120 is anisotropically dry-etched down to the top level of the contact portions 13a and 13b. Thus, the buried bit lines 205a and 205b are formed as shown in FIG. 30. The buried bit lines 205a and 205b fill the bottom portions of the trenches 202a and 202b, and are connected to the lower diffusion layers 206a and 206b via the contact portions 13a and 13b, respectively.

Then, the gate electrodes 208a, 208b, 208c, and 208d (word lines) are formed above the bit lines 205a and 205b, as shown in FIG. 22. The extending direction of the gate electrodes 208a, 208b, 208c, and 208d is perpendicular to the extending direction of the bit lines 205a and 205b.

Then, the silicon nitride film 140 is removed. Then, a process of forming the upper diffusion layers (S/D regions) 210 over the silicon pillars 203a, 203b, and 203c, a process of forming the contact plugs 212 over the upper diffusion layers 210, and a process of forming the capacitor 213 over the contact plugs 212 are carried out. Thus, the semiconductor device shown in FIG. 22 can be obtained.

Regarding the semiconductor device obtained by the above method, a thermal treatment process is carried out to diffuse the impurity included in the contact portions 13a and 13b with the small area into the semiconductor substrate 200 to form the lower diffusion layers 206a and 206b. For this reason, a variation of resistance values of the lower diffusion layers 206a and 206b is likely to become large.

SUMMARY

In one embodiment, a semiconductor device may include, but is not limited to: a semiconductor substrate; a bit line; and a contact portion. The semiconductor substrate has a first groove having at least first and second side surfaces facing each other. The bit line is positioned in the first groove. The bit line is insulated from the semiconductor substrate. The contact portion is positioned in the first groove. The contact portion is electrically connected to the bit line. The contact portion contacts the first side surface of the first groove. The contact portion is insulated from the second side surface of the first groove.

In another embodiment, a semiconductor device may include, but is not limited to: a semiconductor substrate; a bit line; and a contact portion. The semiconductor substrate has first and second grooves crossing each other in plan view. The bottom level of the first groove is lower than the bottom level of the second groove. The first groove has a first portion extending downward from a bottom surface of the second groove. The first portion has at least first and second side surfaces facing each other. The bit line is positioned in the first portion. The bit line is insulated from the semiconductor substrate. The contact portion is positioned in the first portion. The contact portion is electrically connected to the bit line. The contact portion contacts the first side surface of the first portion. The contact portion is insulated from the second side surface of the first portion.

In another embodiment, a semiconductor device may include, but is not limited to: a semiconductor substrate; a first semiconductor portion; a second semiconductor portion; a bit line; and a contact portion. The semiconductor substrate has a first surface and a first groove extending downward from the first surface. The first groove extends in a first horizontal direction. The first groove has at least first and second side surfaces facing each other. The first semiconductor portion extends upward from the first surface of the semiconductor substrate. The first semiconductor portion is adjacent to the first side surface of the first groove in plan view. The second semiconductor portion extends upward from the first surface of the semiconductor substrate. The second semiconductor portion is adjacent to the second side surface of the first groove in plan view. The first and second semiconductor portions are arranged in a second horizontal direction different from the first horizontal direction. The bit line is positioned in the first groove. The bit line is insulated from the semiconductor substrate. The contact portion is positioned in the first groove. The contact portion is electrically connected to the bit line. The contact portion contacts the first side surface of the first groove. The contact portion is insulated from the second side surface of the first groove.

BRIEF DESCRIPTION OF THE DRAWINGS

The above features and advantages of the present invention will be more apparent from the following description of certain preferred embodiments taken in conjunction with the accompanying drawings, in which:

FIG. 3A is a cross-sectional view taken along line A-A shown in FIG. 2;

FIG. 3B is a cross-sectional view taken along line B-B shown in FIG. 2;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Hereinafter, a semiconductor memory device (DRAM) exemplifying a semiconductor device according to a first embodiment of the present invention is explained with reference to FIGS. 1 to 3B.

Figure 1:
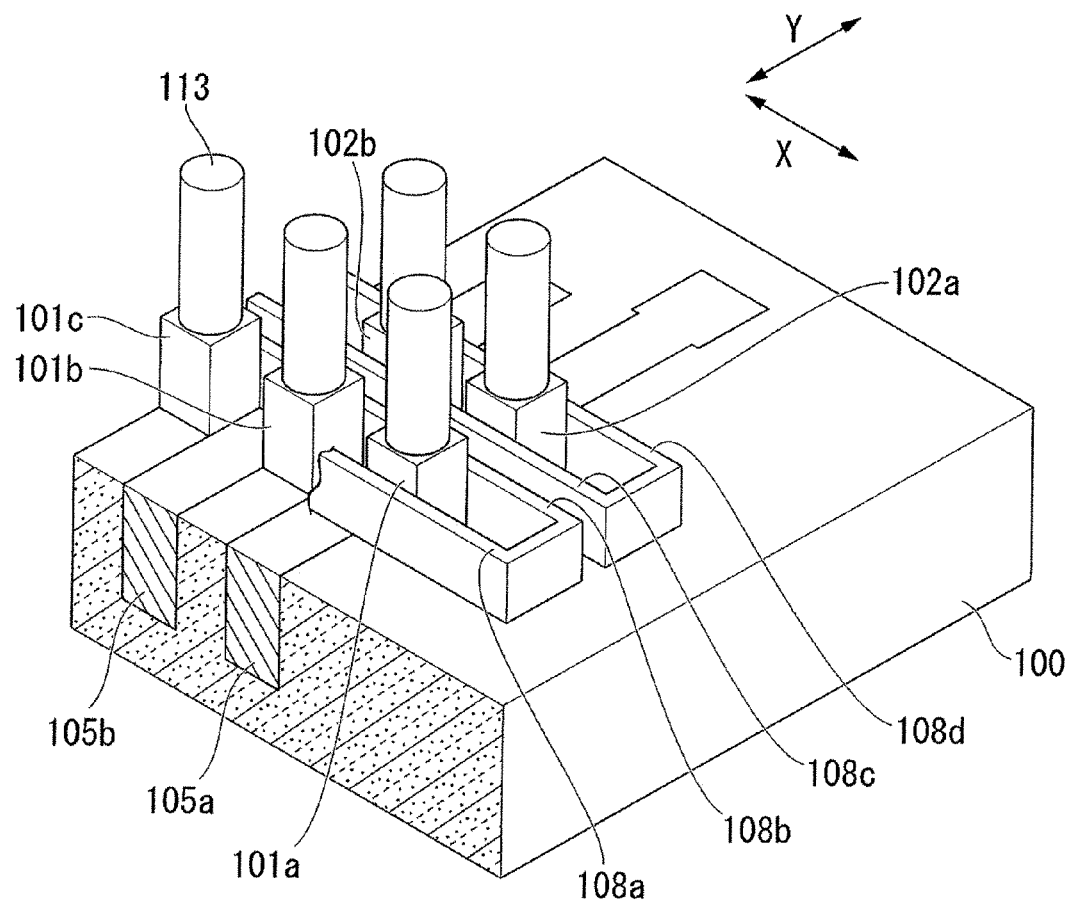
FIG. 1 is a perspective view illustrating a semiconductor memory device (DRAM) exemplifying a semiconductor device according to a first embodiment of the present invention.
Figure 2:
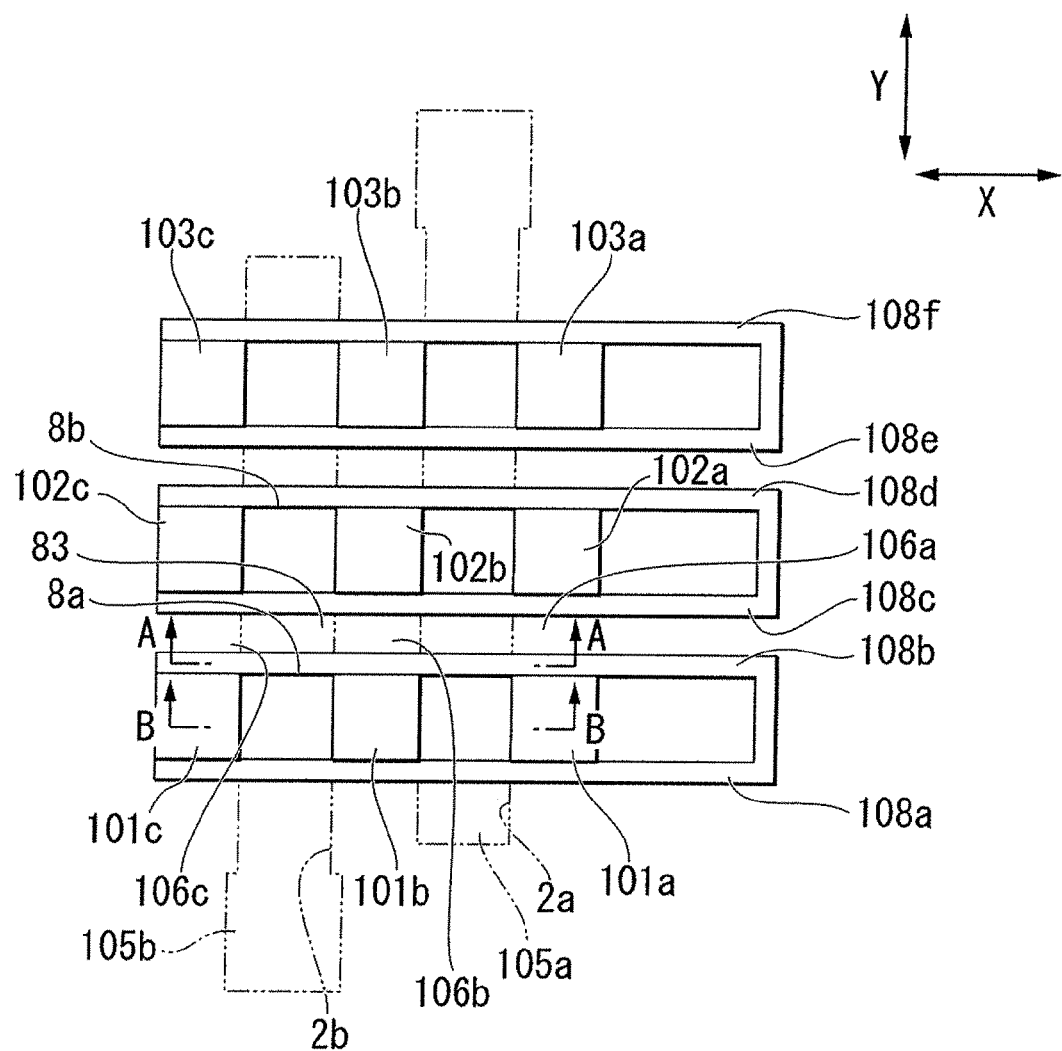
FIG. 2 is a plan view illustrating the DRAM shown in FIG. 1.

FIG. 1 is a perspective view illustrating a memory cell portion of the DRAM. FIG. 2 is a plan view illustrating the DRAM shown in FIG. 1. FIG. 3A is a cross-sectional view taken along line A-A shown in FIG. 2. FIG. 3B is a cross-sectional view taken along line B-B shown in FIG. 2.

For simplification of explanations of the position relationship among silicon pillars, word lines, and buried bit lines, illustration of elements that have nothing to do with the silicon pillars, word lines, and buried bit lines is partially omitted in FIGS. 1 and 2.

The DRAM of the first embodiment shown in FIGS. 1 to 3B includes multiple silicon pillars 101a, 101b, 101c, 102a, 102b, 102c, 103a, 103b, and 103c (the pillars 102c, 103a, 103b, and 103c are not shown in FIG. 1), which become channels of transistors on the semiconductor substrate 100.

Figure 8:
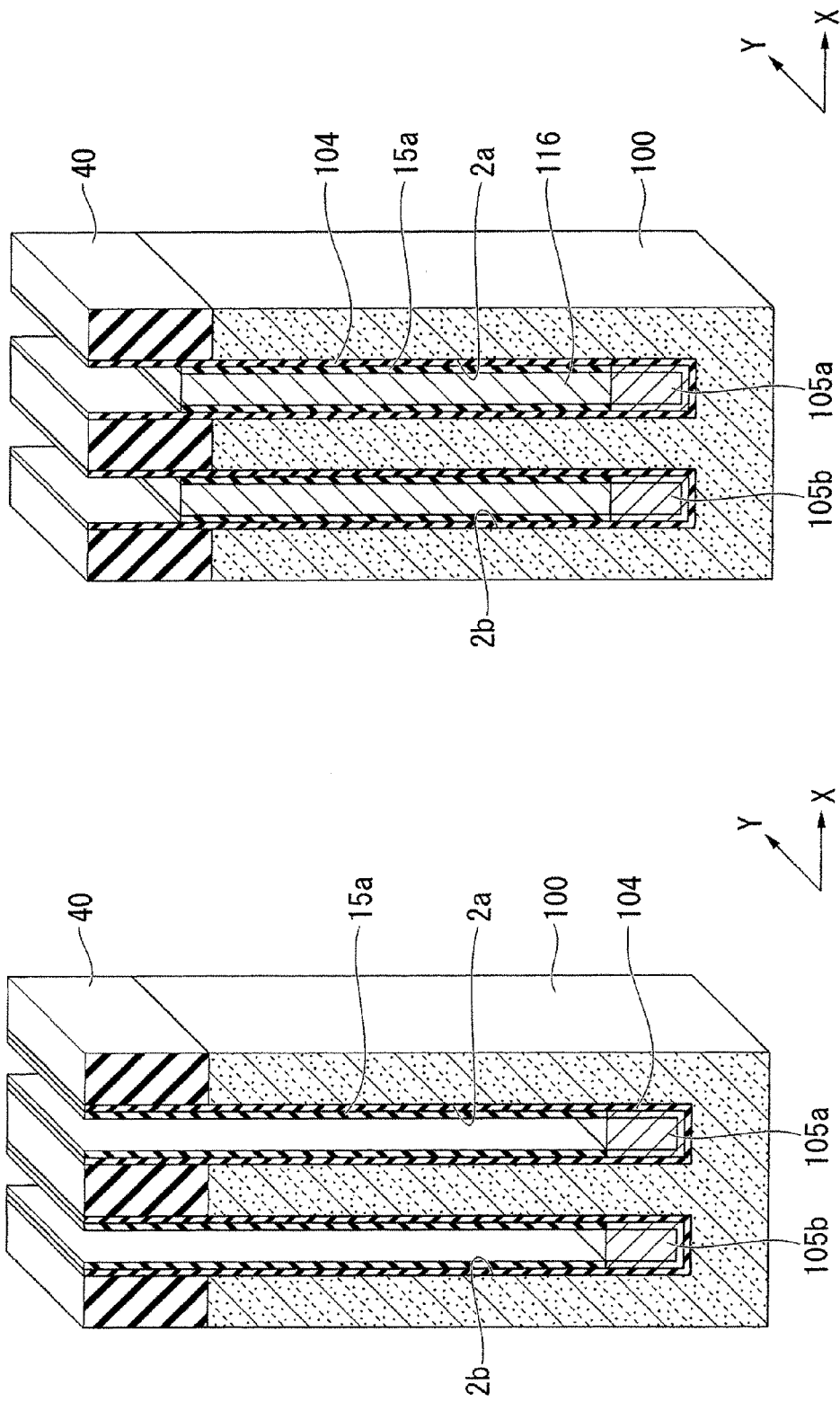

The silicon pillars 101a to 103c are formed in regions defined by multiple bit line trenches (2a and 2b shown in FIGS. 2, 3A, and 3B) and multiple word line trenches (8a shown in FIGS. 2 and 3A, and 8b shown in FIG. 2). In other words, one silicon pillar is formed in a region surrounded by two bit line trenches extending in the Y-direction and two word line trenches extending in the X-direction perpendicular to the Y-direction.

The bit line trenches 2a and 2b extend in the Y-direction (first direction) shown in FIGS. 1 and 2. The word line trenches 8a and 8b extend in the X-direction (second direction) shown in FIGS. 1 and 2. The X-direction is perpendicular to the Y-direction. Thus, the silicon pillars 101a to 103c are regularly arranged in the X and Y directions.

Gate electrodes 108a, 108b, 108c, 108d, 108e, and 108f (108e and 108f are not shown in FIG. 1) of transistors are formed in the word line trenches 8a and 8b. The gate electrodes 108a to 108f extend in the X-direction and function as word lines. Buried bit lines (wires) 105a and 105b are formed in bit line trenches 2a and 2b.

The buried bit lines 105a and 105b extend in the Y-direction. Two adjacent word lines and two adjacent buried bit lines surround one of the silicon pillars 101a to 103c. Each buried bit line is shared by multiple silicon pillars. Specifically, for example, the buried bit line 105a is shared by the silicon pillars 101a, 102a, and 103a.

Although the extending direction of the word lines is perpendicular to that of the buried bit lines as shown in FIG. 2, the gate electrodes 108a to 108f are positioned higher in level than the buried bit lines 105a and 105b in cross-sectional view as shown in FIG. 3A.

Regarding the DRAM shown in FIGS. 1 to 3B, a transistor in a unit cell includes: a silicon pillar that becomes a channel of the transistor; a buried bit line connected to the silicon pillar; and a pair of gate electrodes (word lines) covering opposing side surfaces of the silicon pillar through gate insulating films (not shown in FIGS. 1 to 3B), end portions of the gate electrodes being connected to each other at the end of the cell region.

Specifically, the silicon pillar 101a is connected to the buried bit line 105a. A pair of the gate electrodes (word lines) 108a and 108b cover opposing side surfaces of the silicon pillar 101a. Similarly, the silicon pillar 102a is connected to the buried bit line 105a. A pair of gate electrodes (word lines) 108c and 108d cover opposing side surfaces of the silicon pillar 102a. The other silicon pillars 101c to 103c have similar structures.

As long as the buried bit line is made of a conductive material, a material of the buried bit line is not limited to a specific substance. As a conductive material of the buried bit line, for example, a multi-layered film including a titanium nitride film and a tungsten film over the titanium nitride film may be used.

As long as the gate electrode (word line) is made of a conductive material, a material of the gate electrode is not limited to a specific substance. As a conductive material of the gate electrode (word line), for example, the same material as that of the buried bit line may be used.

An isolation groove 83 is provided between two adjacent word lines (for example, gate electrodes 108b and 108c). The two adjacent word lines are arranged between two adjacent silicon pillars (for example, 101a and 102a). The isolation groove 83 is filled with an inter-layer insulating film. The inter-layer insulating film isolates the two word lines from each other.

The DRAM shown in FIGS. 1 to 3B has a double-gate structure in which two word lines are connected to one silicon pillar. However, the buried bit line is connected to only one line of silicon pillars.

As shown in FIGS. 3A and 3B, the insulating film (groove bottom insulating film) 104, which is made of a thermal oxide film, is formed so as to cover an inner surface of a lower portion of the bit line trench 2a (2b). The buried bit line 105a (105b) covers the insulating film 104 so as to fill the lower portion of the bit line trench 2a (2b). The buried bit line 105a (105b) is connected to the lower diffusion layer 106b (106c) via the contact portion 3a (3b). A sidewall 15 covers one of the opposing side surfaces of the bit line trench 2a (2b), the opposing side surfaces facing in the X-direction. The sidewall 15 is positioned higher in level than the buried bit lines 105a (105b).

As shown in FIG. 3A, the contact portion 3a (3b) is formed in the bit line trenches 2a (2b) and under the word line trench 8a. In other words, the contact portion 3a (3b) is formed in a region in which the buried bit line 105a (105b) crosses the word line trench 8a in plane view. The contact portions 3a and 3b are formed by filling, with a conductive material, contact holes 31a and 31b extending downward from a bottom surface 81a of the word line trench 8a, respectively.

A material forming the contact portions 3a and 3b is not limited to a specific substance. The contact portions 3a and 3b may be made of, for example, the same material as those of the buried bit lines 105a and 105b. Specifically, the contact portions 3a and 3b may be made of a multi-layered film including a titanium nitride film and a tungsten film over the titanium nitride film.

As shown in FIG. 3A, each of the contact holes 31a and 31b has a bottom surface 8c and side surfaces. The bottom surface 8c contacts the buried bit line 105a (105b). The side surfaces of the contact hole 31a (31b) includes: a side surface 8d that contacts the lower diffusion layer 106c (106b) in the semiconductor substrate 100; and other side surfaces 8e that contact an insulating film. The side surface 8f, which is one of the side surfaces 8e and opposes the side surface 8d, contacts the sidewall 15. The opposing side surfaces 8e, which face in the Y-direction, contact the inter-layer insulating film 109b shown in FIG. 3B.

Each of the lower diffusion layers 106a, 106b, and 106c functions as an S/D region of the transistor. The lower diffusion layers 106a, 106b, and 106c are formed by diffusing an impurity into an upper surface region of the semiconductor substrate 100, which overlaps the word line 108b in plan view, as shown in FIGS. 2 and 3A. Upper surfaces 106d of the lower diffusion layers 106a, 106b, and 106c are lower in level than a lower surface of the word line 108b. The lower diffusion layers 106a, 106b, and 106c are insulated from the word line 108b by an inter-layer insulating film (included in the word line trench) 109a.

A material forming the inter-layer insulating film 109a is not limited to a specific substance as long as the inter-layer insulating film 109a can insulate the word line 108b, the contact portions 3a and 3b, and the lower diffusion layers 106a, 106b, and 106c from one another. The inter-layer insulating film 109a may be made of, for example, a multi-layered film including a silicon oxynitride film 9a and a silicon oxide film 9b over the silicon oxynitride film 9a.

In the first embodiment, an impurity, such as arsenic or phosphorus, is introduced into the lower diffusion layers 106a, 106b, and 106c. The concentration of the impurity included in the lower diffusion layers 106a, 106b, and 106c decreases in the downward direction (from the top portion thereof to the bottom portion thereof).

As shown in FIGS. 3A and 3B, the insulating film 104 covers the bottom and lower side surfaces of the bit line trenches 2a and 2b, and thereby insulates the buried bit lines 105a and 105b from the semiconductor substrate 100. An upper surface 105d of the buried bit line 105a (105b) contacts the contact portion 3a (3b) in a region where the buried bit line 105a (105b) crosses the word line trench 8a in plan view, as shown in FIG. 3A. The upper surface 105d of the buried bit lines 105a (105b) contacts the inter-layer insulating film 109b in a region between the word line trenches 8a in plan view, as shown in FIG. 3B.

A material forming the inter-layer insulating film 109b is not limited to a specific substance as long as the inter-layer insulating film 109b can insulate adjacent silicon pillars arranged in the Y-direction from each other. The inter-layer insulating film 109 may be, for example, a multi-layered film including a silicon oxynitride film 9a and a silicon oxide film 9b over the silicon oxynitride film 9a.

The side surface 8d of the contact portion 3a (3b), which is one of the opposing side surfaces facing in the X-direction, contacts the silicon pillar 106b (106c), as shown in FIG. 3A. The side surface 8f of the contact portion 3a (3b), which is the other one of the opposing side surfaces facing in the X-direction, is insulated from the silicon pillar 106a (106b) by the sidewall 15 and the insulating film 104. The opposing side surfaces 8e of the contact portions 3a (3b), which face in the Y-direction, contact the insulating film 109b, as shown in FIG. 3B (see FIG. 16).

In other words, the buried bit line 105a (105b) is connected to the lower diffusion layer 106b (106c) of the silicon pillar 101b (101c) via the contact portion 3a (3b). However, the buried bit line 105a (105b) is disconnected from the lower diffusion layer 106a (106b) of the silicon pillar 101a (101b).

An upper diffusion layer 110 is formed in a top region of each of the silicon pillar 101a to 103c, as shown in FIG. 3B. The upper diffusion layer 110 functions as the other S/D region of the transistor. An impurity, such as boron fluoride ($BF_2$), is diffused in the upper diffusion layer 110. In the first embodiment, for example, the upper diffusion layer 110 contains a p-type impurity, and the lower diffusion layer 106a, 106b, and 106c contain an n-type impurity.

An inter-layer insulating film 11 is formed over the upper diffusion layer 110 and the inter-layer insulating films 109a and 109b, as shown in FIG. 3B. A contact plug 112 is formed in the insulating film 11 so as to be connected to the upper diffusion layer 110. A capacitor 113 is formed over the insulating film 11. The capacitor 113 includes a lower electrode 113a, a capacitor insulating film 113b, and an upper electrode 113c. The silicon pillar 101a to 103c and the contact plugs 112 are isolated from one another by the inter-layer insulating film 109a, 109b, and 11.

Regarding the silicon pillar 101b, one vertical transistor is formed, which includes: the lower diffusion layer 106b (shown in FIG. 3A) connected to the buried bit line 105a via the contact portion 3a; the upper diffusion layer 110 connected to the capacitor 113; and a pair of the gate electrodes 108a and 108b (shown in FIG. 2) which cover the opposing side surfaces of the silicon pillar 101b, and which are positioned higher in level than the lower diffusion layer 106b and lower in level than the upper diffusion layer 110.

Although FIG. 2 shows nine silicon pillars included in the DRAM for simplification of explanation, the number of silicon pillars is not limited thereto. Preferably, several thousand to several hundred thousand silicon pillars are arranged. In this case, several hundred to several thousand buried bit lines and word lines are preferably arranged.

Figure 4:
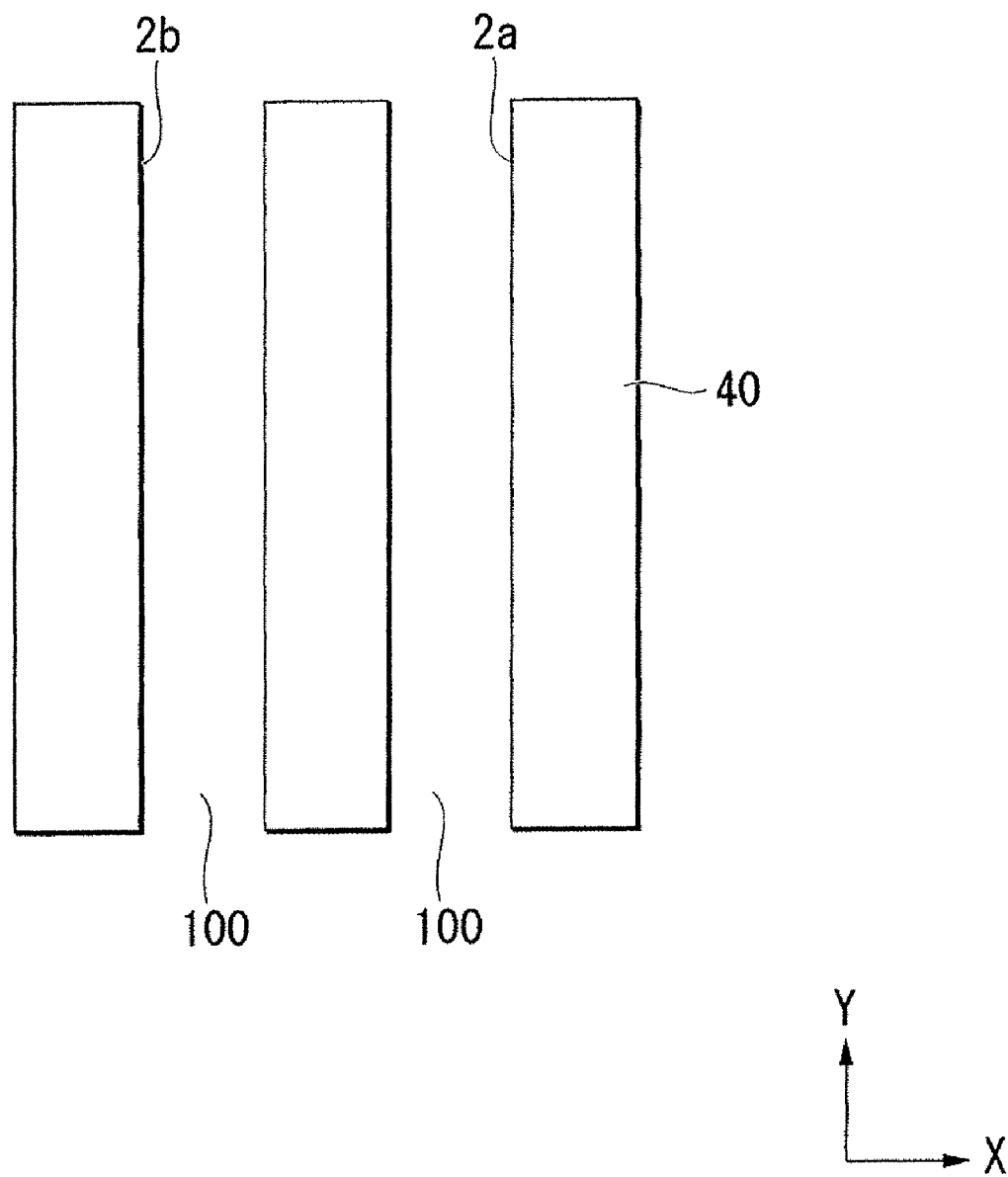
FIG. 4 is a plan view illustrating one process included in a method of manufacturing the DRAM shown in FIGS. 1 to 3B.
Figure 5:
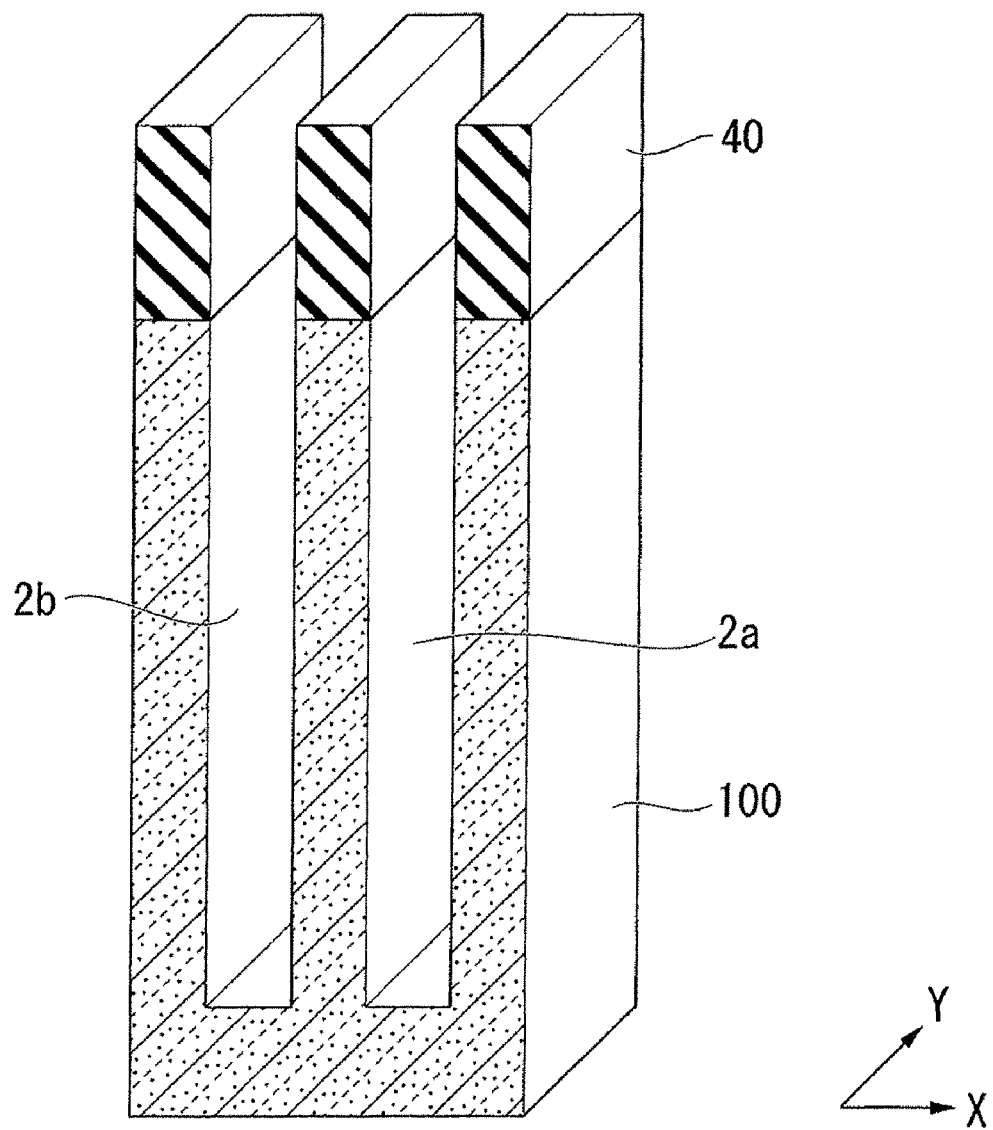
FIGS. 5 to 21 are cross-sectional view illustrating a process flow indicative of the method of manufacturing the DRAM shown in FIGS. 1 to 3B.

Hereinafter, a method of manufacturing the DRAM shown in FIGS. 1 to 3B is explained with reference to FIGS. 4 to 21. FIGS. 4 to 21 illustrate the method of manufacturing the DRAM shown in FIGS. 1 to 3B. FIG. 4 is a plan view illustrating part of the DRAM during manufacturing. FIGS. 5 to 21 are cross-sectional perspective views illustrating part of the DRAM during manufacturing. The most anterior surfaces shown in FIGS. 5 to 21 are cross-sections taken along the line A-A shown in FIG. 2.

Firstly, multiple bit line trenches 2a and 2b are formed in the semiconductor substrate 100. Specifically, a silicon nitride film 40 is formed over the semiconductor substrate 100 by a low pressure CVD (Chemical Vapor Deposition)

method. In the first embodiment, a silicon mono-crystalline substrate is used as the semiconductor substrate 100.

Then, bit line openings, which partially expose an upper surface of the semiconductor substrate 100, are formed in the silicon nitride film 40 by photolithography and dry-etching processes. Then, the semiconductor substrate 100 is anisotropically dry-etched with the silicon nitride film 40 as a mask. Thus, bit line trenches 2a and 2b, which extend in the Y-direction (first direction), are formed as shown in FIGS. 1 and 2. An illustration of the contact portions for pulling up bit lines is omitted in FIGS. 4 to 21. As the above anisotropic dry etching process, for example, an ICP-RIE (Inductively Coupled Plasma Reactive Ion Etching) method may be used.

Figure 6:
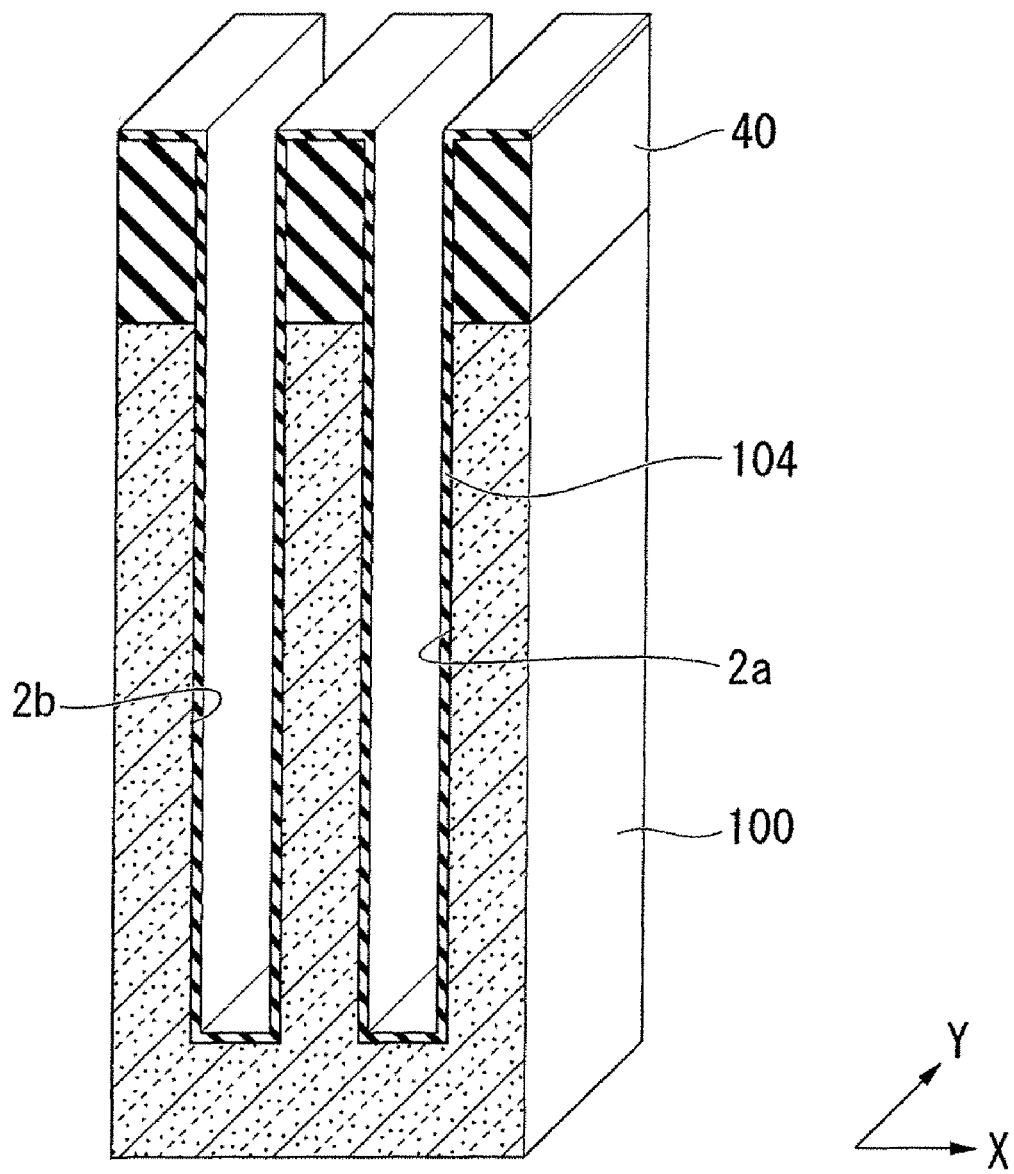

Then, the insulating film (groove bottom insulating film) 104 is formed by a thermal oxidation method so as to cover inner surfaces of the bit line trenches 2a and 2b and an upper surface of the silicon nitride film 40, as shown in FIG. 6. The insulating film 104 is made of a silicon oxide film.

Figure 7:
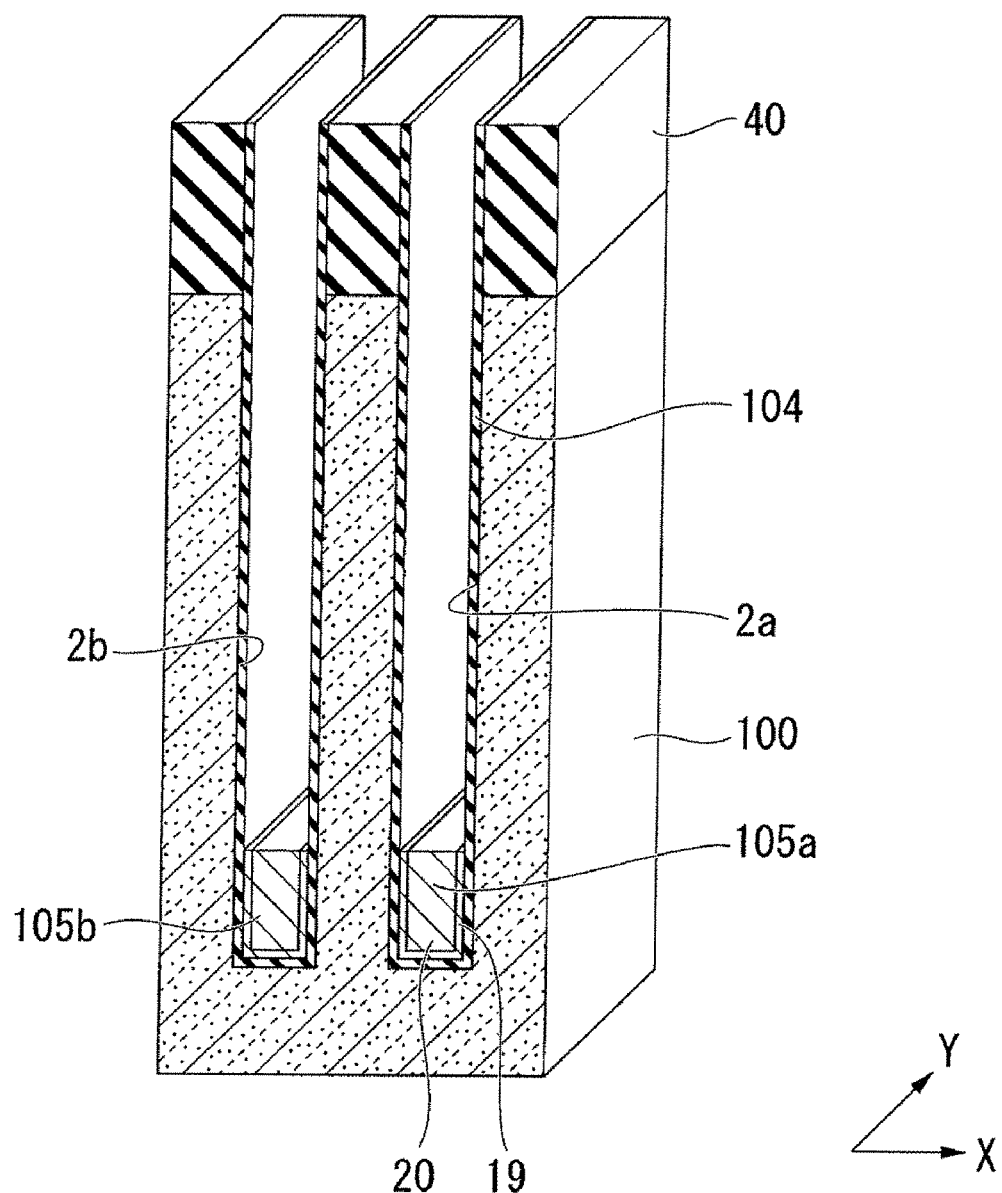

Then, a wiring material layer, which is made of a conductive material that will be the buried bit lines 105a and 105b, is formed by the CVD method so as to fill the bit line trenches 2a and 2b. Preferably, the wiring material layer is a multi-layered film including a titanium nitride film 19 covering the insulating film 104, and a tungsten film 20 covering the titanium nitride film 19 and filling the bit line trenches 2a and 2b, as shown in FIG. 7.

Then, the wiring material layer is anisotropically dry-etched down to the top level of the contact portions 3a and 3b. Thus, the buried bit lines 105a and 105b are formed as shown in FIG. 7.

Then, a process of forming the sidewall 15 is carried out. In the first embodiment, the sidewall forming process is carried out after forming the buried bit lines 105a and 105b, before forming the word line trench 8a that will be explained later.

In the process of forming the sidewall 15, a sidewall 15a shown in FIG. 8A is formed first by the following method. Then, part of the sidewall 15a is removed to form the sidewall 15 covering only one of the opposing side surfaces of the bit line trench 2a (2b) which face in the X-direction, i.e., covering only the right side surface of the bit line trench 2a (2b) in the case of FIG. 8A (see FIG. 10).

To form the sidewall 15, a silicon nitride film is formed by the CVD method over the entire surface of the semiconductor substrate 100. Then, the silicon nitride film is anisotropically dry-etched so as to expose upper surfaces of the buried bit lines 105a and 105b. Thus, the sidewall 15a made of the silicon nitride film is formed so as to cover exposed surfaces of the insulating film 104 covering the opposing side surfaces of the bit line trenches 2a (2b), as shown in FIG. 8A. The sidewall 15a is positioned higher in level than the buried bit line 105a and 105b.

Then, a silicon oxide film 116 is formed so as to fill remaining space in the bit line trenches 2a and 2b. For example, the CVD method, an ALD (Atomic Layer Deposition) method, or a spin-coating method may be used to form the silicon oxide film 116. Then, only top portions of the silicon oxide film 116 and the sidewall 15a are removed by an etching process, as shown in FIG. 8B.

Then, a silicon film 118 is formed by the CVD method over the entire surface of the semiconductor substrate 100. Preferably, a noncrystalline silicon film is used as the silicon film 118 so that crystalline grains do not cause an uneven etching. A noncrystalline silicon film can be obtained by adjusting a film forming temperature to 540° C. or less.

Figure 9:
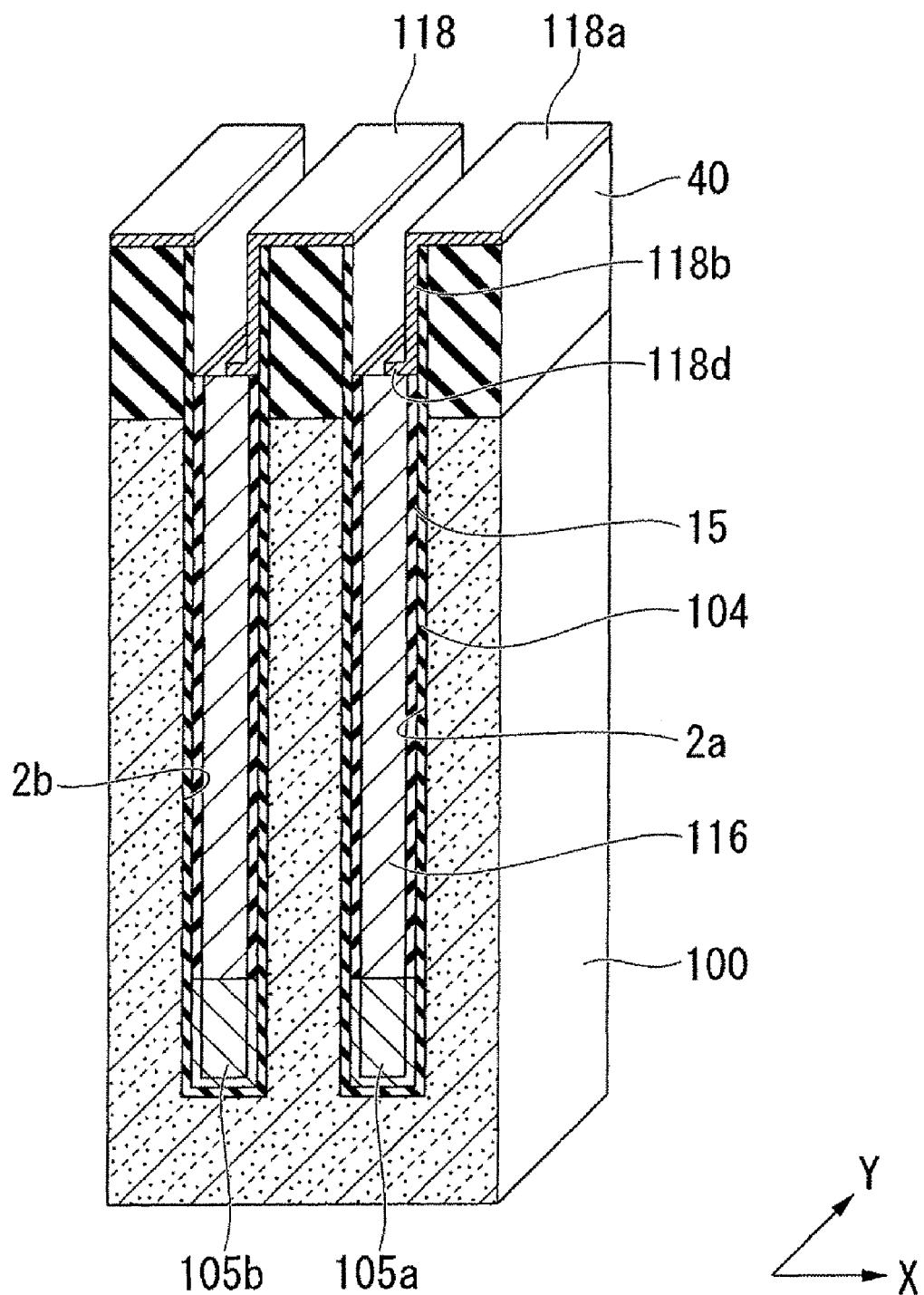

Then, an impurity is introduced into: an upper portion 118a of the silicon film 118, which covers an upper surface of the silicon nitride film 40; a side portion 118b of the silicon film 118, which covers one side surface of the bit line trench 2a (2b) (the right side surface in the case of FIG. 9); part of a lower portion 118d of the silicon film 118, which covers an upper surface of the silicon oxide film 116 (which covers the right half of the upper surface of the silicon oxide film 116 in the case of FIG. 9).

The portion 118b of the silicon film 118 covers one of the two opposing side surfaces of the bit line trench 2a (2b) (the right side surface in the case of FIG. 9), which is the side surface from which the sidewall 15a is not to be removed later. The impurity, which is introduced into the silicon film 118, may be, for example, boron fluoride ($BF_2$).

As a method of introducing an impurity into the upper portion 118a, the side portion 118b, and part of the lower portion 118d without introducing the impurity into the other side portion of the silicon film 118 (the left side portion in the case of FIG. 9), for example, an oblique ion implantation may be used. FIG. 9 illustrates the case in which the oblique ion implantation is used to selectively introduce an impurity into the silicon film 118.

When an impurity is introduced into the silicon film 118, the impurity has to be introduced not only into the side portion 118b, but also into part of the lower portion 118d that vertically extends from the side portion 118b. For this reason, a two-step ion implantation method, which uses two different implantation angles at which an impurity is implanted, may be used to achieve the optimal implantation angle with respect to the side portion 118b and part of the lower portion 118d. Here, the implantation angle indicates an inclination angle formed by the ion implantation direction and a perpendicular line to the upper surface of the semiconductor substrate 100.

When the two-step implantation method is used to introduce an impurity into the silicon film 118, for example, ion implantation is preferably carried out at an acceleration energy of 5 keV, at a dose amount of $2E14\ cm^{-2}$, and at two implantation angles of 20 degrees and 30 degrees. The implantation angles may be adjusted according to the thickness of the lower portion 118d and the vertical length of the side portion 118b.

Then, impurity-free portions of the silicon film 118, which do not contain the impurity (the left side portion of the silicon film 118 and the left half of the lower portion 118d), are removed by a wet-etching process with an etchant, such as ammonia water ($NH_3$). Thus, the half of the upper surface of the silicon oxide film 116 (the left half thereof in the case of FIG. 9) is exposed. Additionally, the upper surface of one of the sidewalls 15a, which cover the opposing side surfaces of the bit line trench 2a (2b), is exposed, as shown in FIG. 9.

Figure 10:
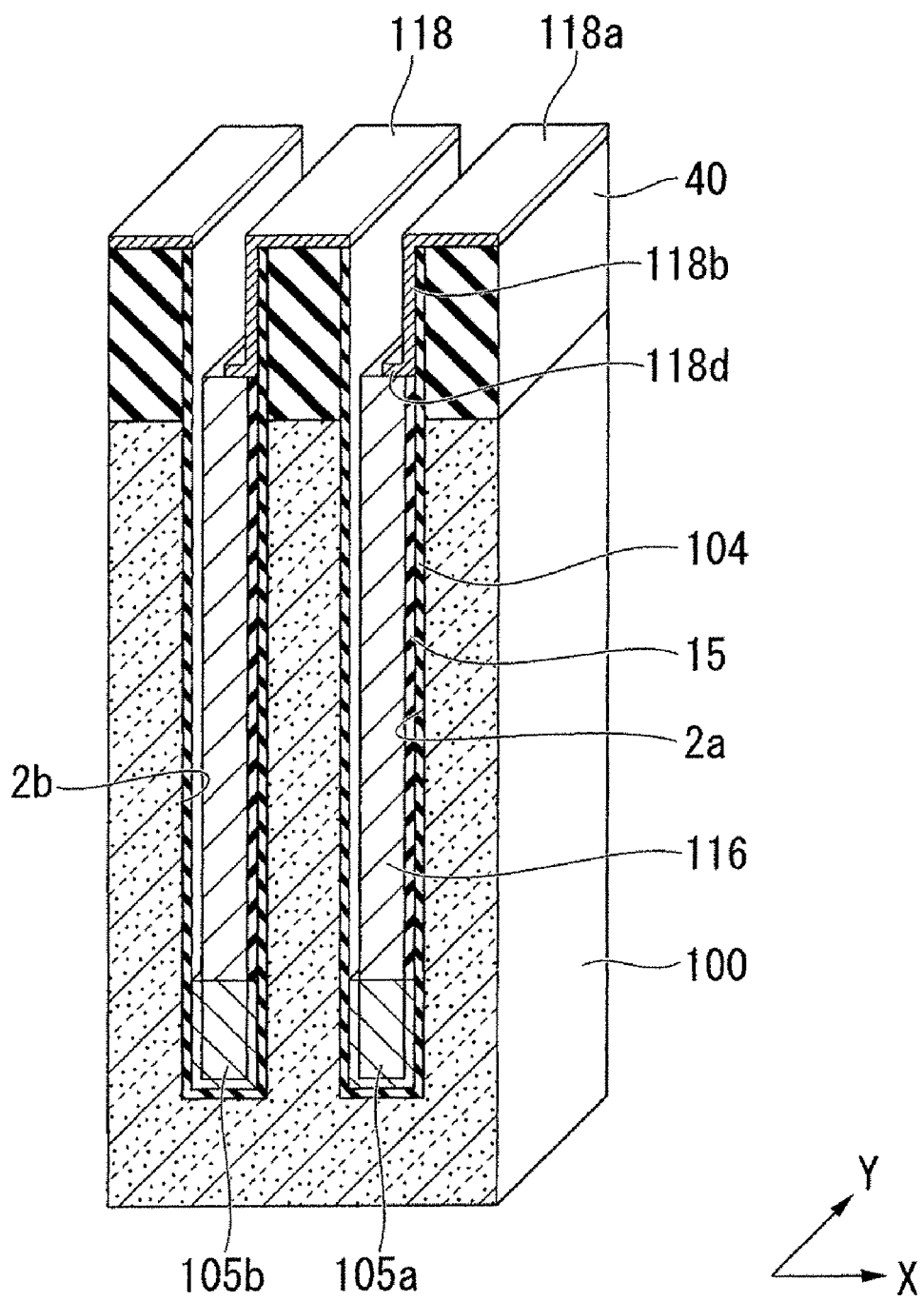

Then, the exposed one of the sidewall 15a is removed by a wet-etching process with the remaining portions of the silicon film 118 (the side portion 118b, the right half of the lower portion 118d, and the upper portion 118a, which are shown in FIG. 10) as masks. Thus, the sidewall 15, which covers one of the opposing side surfaces of the bit line trench 2a (2b) facing in the X direction (the right side surface in the case of FIG. 10), remains as shown in FIG. 10. Additionally, a portion of the insulating film 104, which covers one of the opposing side surfaces of the bit line trench 2a (2b) (the left side surface in the case of FIG. 10), is exposed.

When the sidewall 15 and the insulating film 104 are made of a titanium nitride film and a silicon oxide film, respectively, a mixed solution containing ammonia and hydrogen peroxide, which can efficiently and selectively remove the sidewall 15, is preferably used as an etchant used for the wet etching of the sidewall 15.

The sidewall 15 prevents a necessary portion of the insulating film 104 from being etched in a later wet-etching process of removing the silicon oxide film 116 and part of the insulating film 104 and in a later wet-etching process of removing the inter-layer insulating film 109b. Further, after the contact portions 3a and 3b are formed, the sidewall 15 and the insulating film 104 prevent the contact portions 3a and 3b from being improperly connected to other lower diffusion layers adjacent to the lower diffusion layers to be connected to the contact portions 3a and 3b.

Thus, in the first embodiment, the sidewall 15 covers only one of the opposing side surfaces of the bit line trench 2a (2b), which face in the X-direction. Further, the portion of the insulating film 104, which covers the left side surface of the bit line trench 2a (2b), is exposed to the bit line trench 2a (2b). The exposed portion of the insulating film 104 will be removed in a later process to form the contact portions 3a and 3b that connect the buried bit line 105a (105b) and the lower diffusion layer 106b (106c).

In the first embodiment, the entire left portion of the insulating film 104 is exposed to the bit line trench 2a (2b). Accordingly, the sidewall 15 can be easily formed with high precision compared to when part of the left portion of the insulating film 104 is exposed. Accordingly, the method of the first embodiment is easily applicable to the miniaturization of semiconductor devices.

More specifically, if part of the left portion of the insulating film 104 is exposed, the sidewall with a predetermined shape, which covers the left side surface of the bit line trench 2a (2b), has to remain. For this reason, a sacrificial layer covering the sidewall has to be provided. Therefore, a process of forming such a sacrificial layer, and a process of making the shape of the sidewall being a predetermined shape are required, thereby making the manufacturing process more complicated than those of the first embodiment of the present invention and degrading productivity.

Further, since such a sacrificial layer covering the sidewall has to be provided, the inner diameters of the bit line trenches 2a and 2b are decreased by the thickness of the sacrificial layer. Consequently, defective etching, such as the case where an etching residual remains in the bit line trenches 2a and 2b, is likely to occur when the shape of the sidewall is adjusted, thereby making the manufacturing processes more inapplicable to the miniaturization of semiconductor devices than the manufacturing method of the first embodiment of the present invention.

Figure 11:
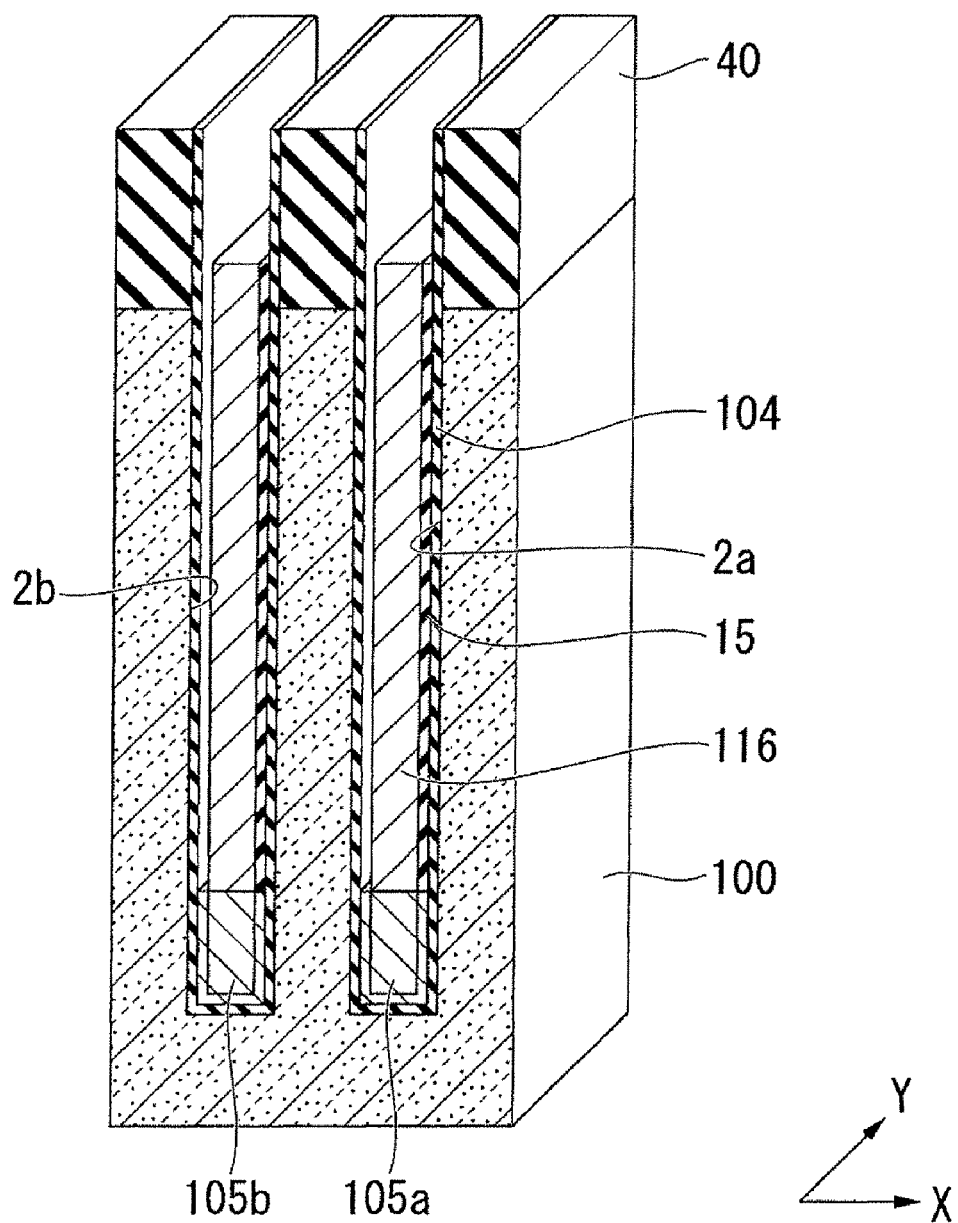
Figure 12:
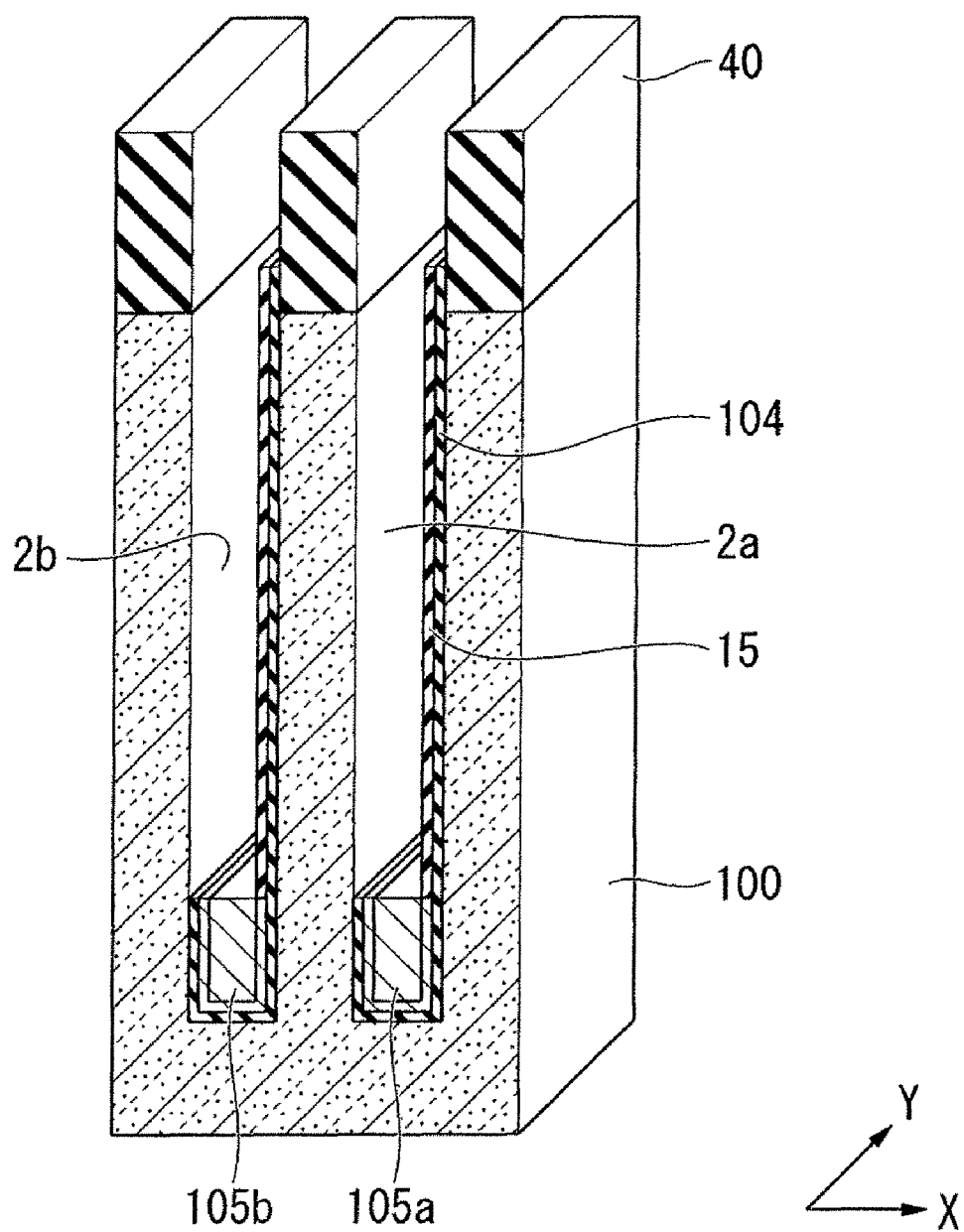

Then, the remaining portions of the silicon film 118 are removed by an isotropic dry-etching process, as shown in FIG. 11. Then, the exposed silicon oxide film 116, and the exposed portion of the insulating film 104 which is made of a silicon oxide film and covers the one side surface of the bit line trench 2a (2b), are removed by a wet-etching process with an etchant, such as a hydrofluoric acid solution. Thus, one of the opposing side surfaces of the bit line trench 2a (2b), which is a side surface of the semiconductor substrate 100, is exposed as shown in FIG. 12. Additionally, the buried bit lines 105a and 105b, which fills the lower portions of the bit line trenches 2a and 2b, respectively, are exposed as shown in FIG. 12.

Figure 13:
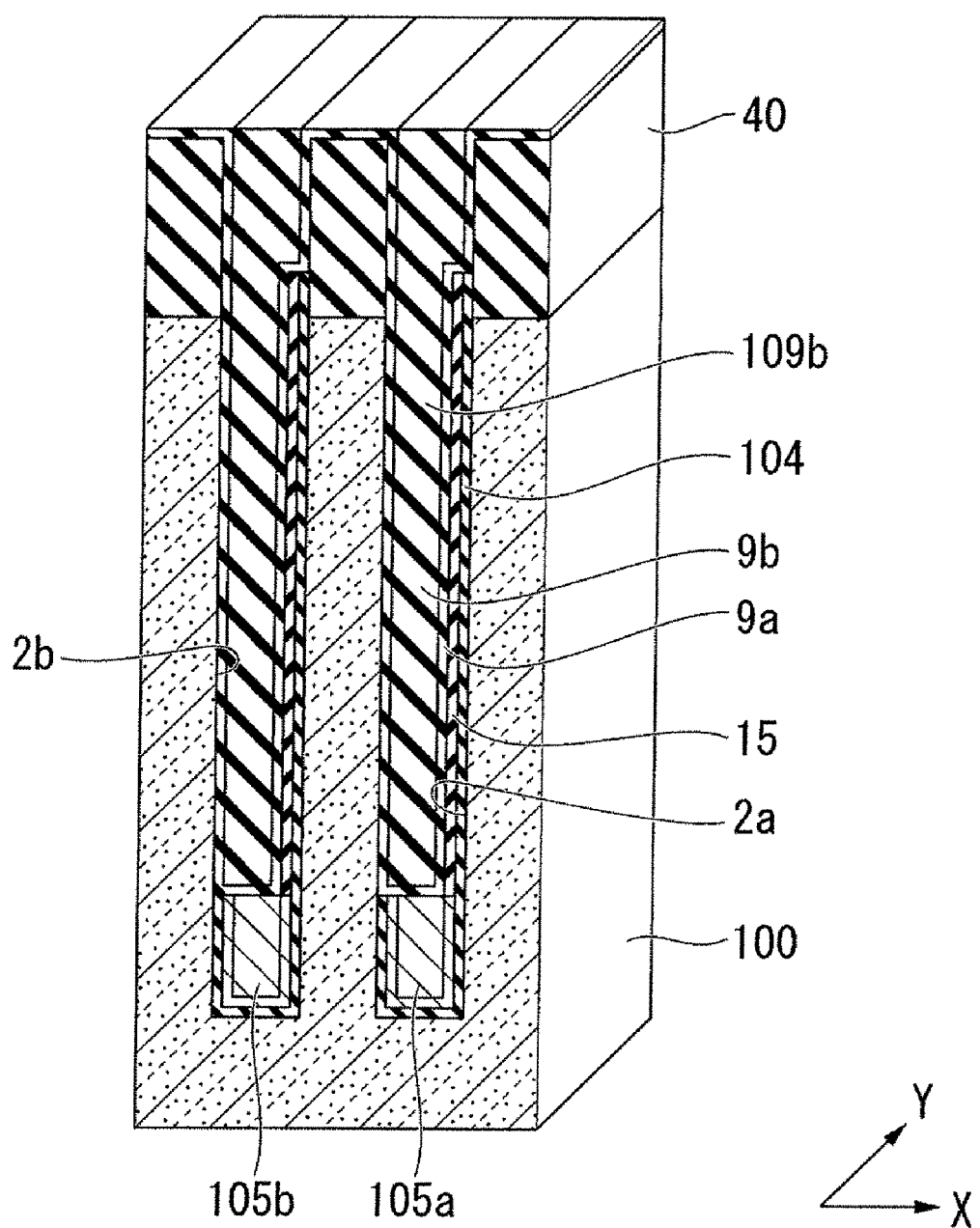

Then, a silicon oxynitride film 9a is formed by the CVD method so as to cover inner surfaces of the bit line trenches 2a and 2b, as shown in FIG. 13. Then, a silicon oxide film 9b, which fills the bit line trenches 2a and 2b, is formed over the silicon oxynitride film 9a with use of an SOD (spin-on-dielectric) material. Thus, the inter-layer insulating film 109b, which includes the silicon oxynitride film 9a and the silicon oxide film 9b, is formed so as to fill the bit line trenches 2a and 2b, as shown in FIG. 13.

Figure 14:
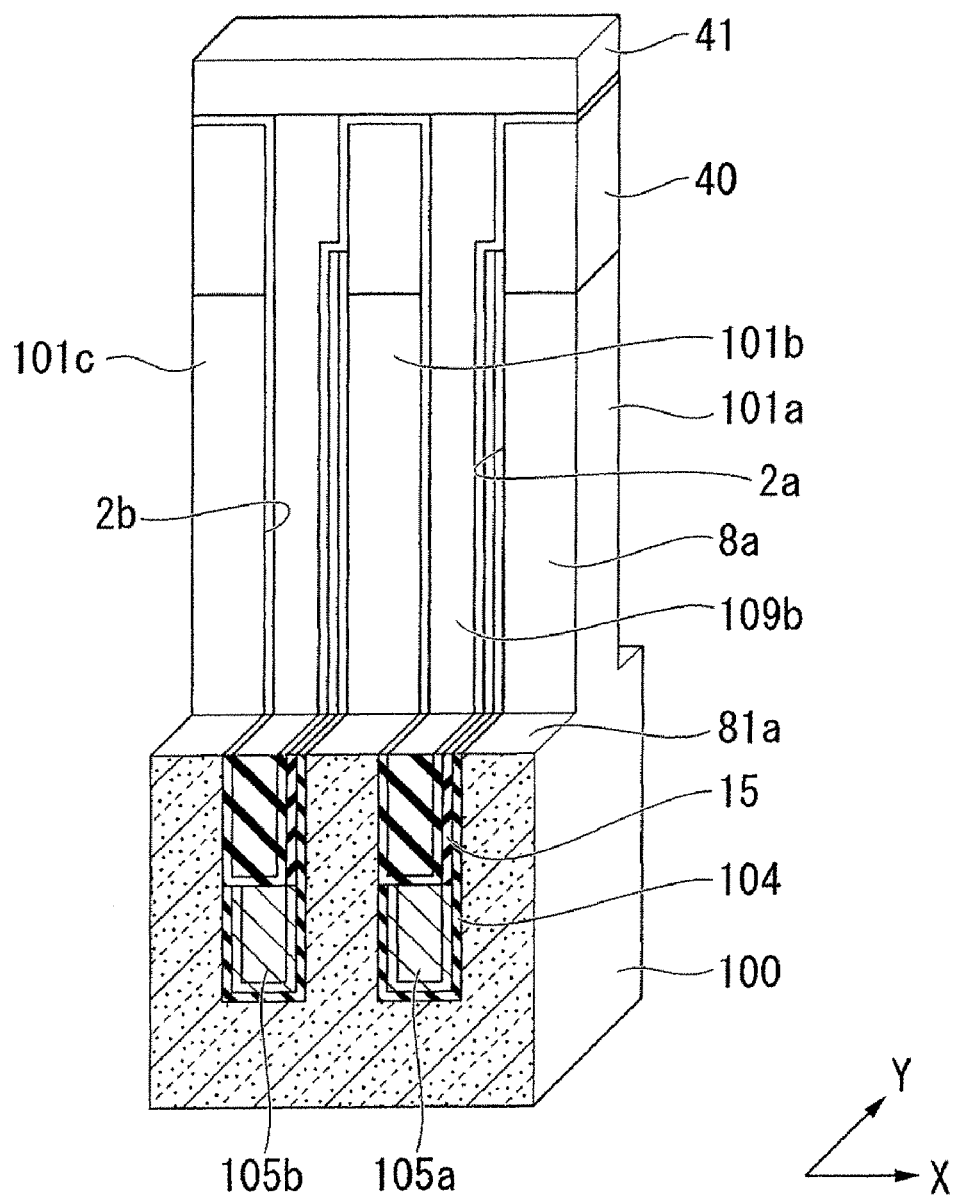
Figure 15:
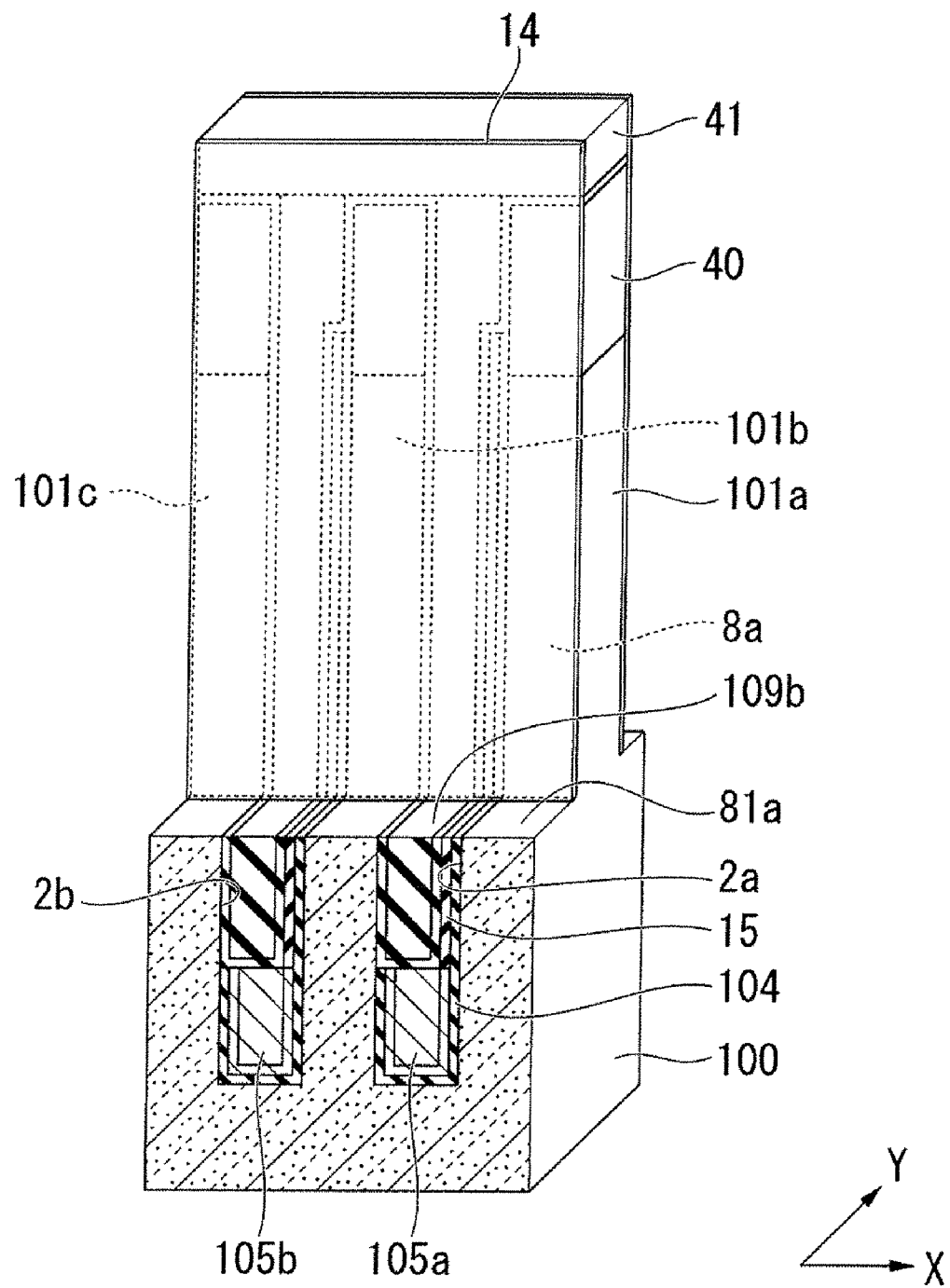

Then, a silicon oxide film 41 is formed over the silicon nitride film 40. Then, a dry-etching process is carried out to form word line trenches 8a extending in the X-direction (second direction), as shown in FIG. 14. The bottom surface 81a of the word line trench 8a is higher in level than the upper surfaces of the buried bit lines 105a and 105b. The dry-etching process is carried out under a condition such that the silicon oxide films 41 and 9b, the silicon nitride film 40, the silicon oxynitride film 9a, and the silicon substrate 101a, 101b, and 101c are etched at the same etching rate. Alternatively, the insulating film and the silicon film may be etched separately.

Thus, in a region where the word line trench 8a crosses the buried bit lines 105a and 105b in plan view, the inter-layer insulating film 109b, which fills the bit line trenches 2a and 2b, is exposed to the word line trench 8a, as shown in FIG. 14. Additionally, in a region between the bit line trenches 2a and 2b, the semiconductor substrate 100 (the silicon substrate 101a, 101b, and 101c) is exposed to the word line trench 8a. The word line trenches 8a define silicon pillars 101a to 103c (only the silicon pillars 101a, 101b and 101c are shown in FIG. 14).

Then, a silicon nitride film is formed by the CVD method over the entire surface of the semiconductor substrate 100. Then, the silicon nitride film is anisotropically dry-etched so as to expose part of the semiconductor substrate 100 (the bottom surface 81a of the word line trenches 8a). Thus, a sidewall mask 14, which is made of the silicon nitride film, is formed so as to cover the entire side surfaces of the word line trenches 8a.

Figure 16:
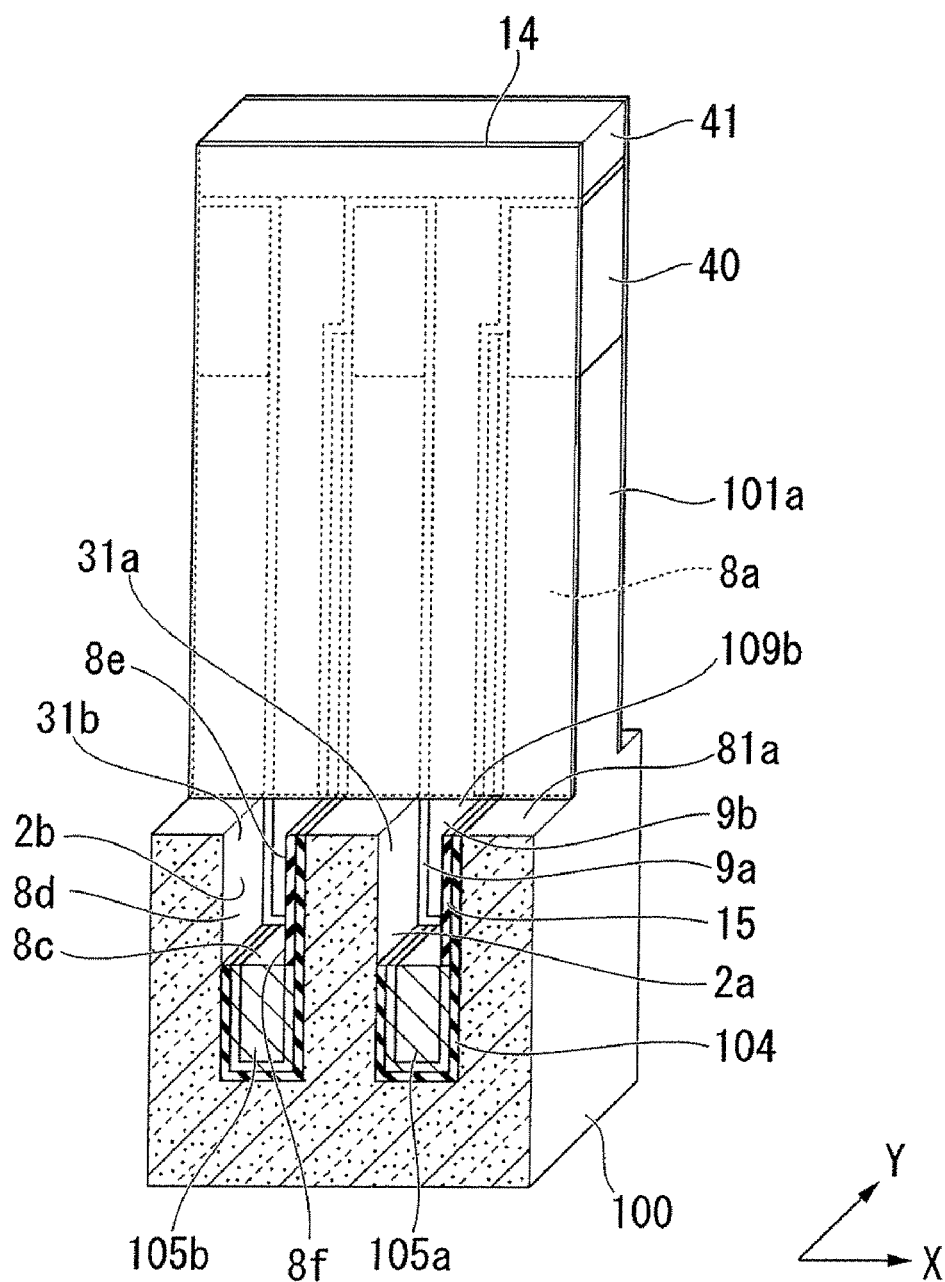
Figure 17:
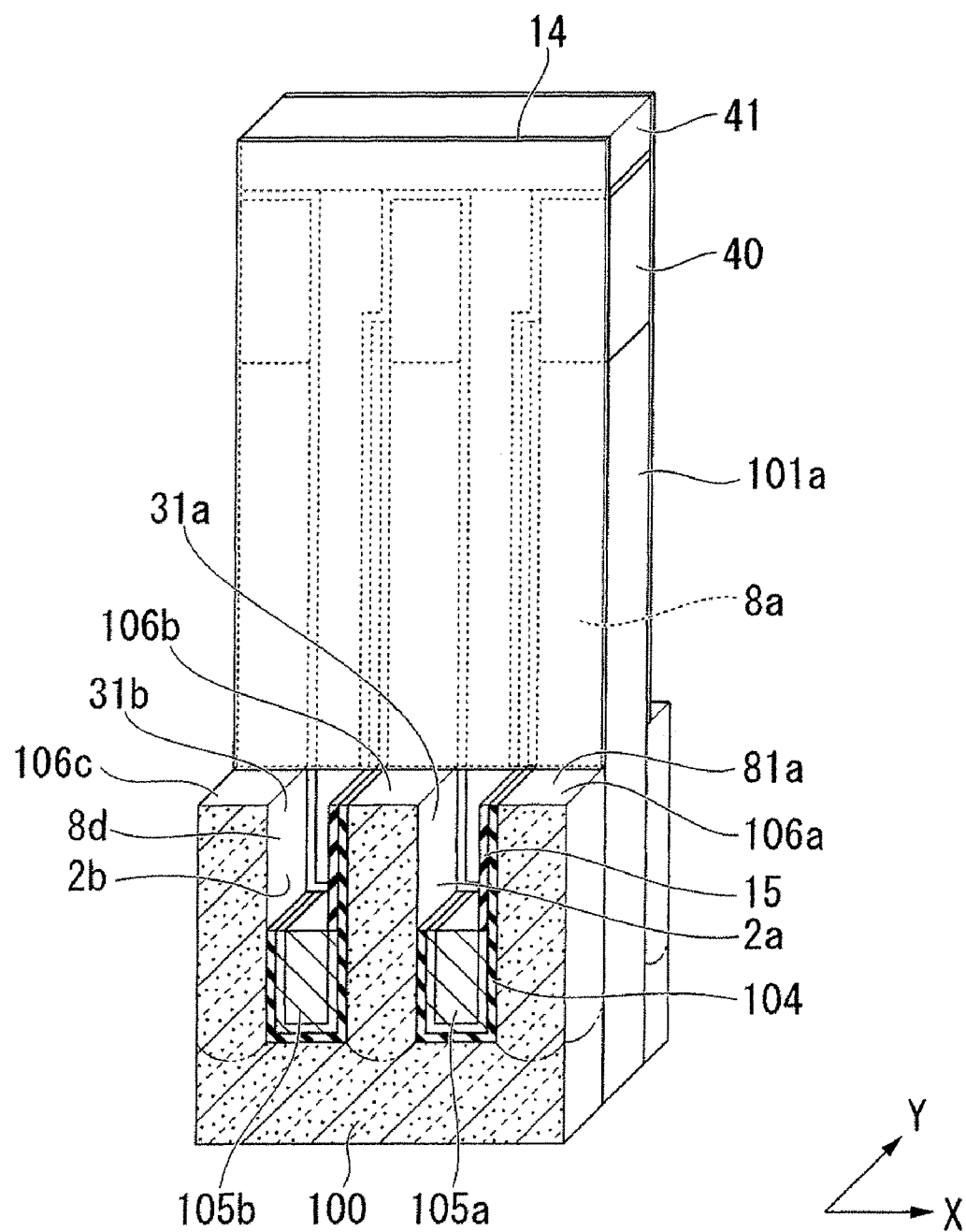

Then, the silicon oxynitride film 9a and the silicon oxide film 9b, which are included in the inter-layer insulating film 109b and exposed to the word line trenches 8a, are removed by a dry-etching process. Thus, the contact holes 31a and 31b, which extend downward from the bottom surface 81a of the word line trench 8a, are formed in a region where the buried bit lines 105a and 105b cross the word line trench 8a in plan view, as shown in FIG. 16. The contact holes 31a and 31b expose the upper surfaces of the buried bit lines 105a and 105b.

Each of the contact holes 31a and 31b includes a bottom surface 8c and side surfaces 8d, 8e, and 8f. The bottom surface 8c is the exposed upper surface of the buried bit line 105a (105b). The side surface 8d is one of the opposing side surfaces of the contact hole 31a (31b) facing in the X-direction, and is the exposed side surface of the semiconductor substrate 100 (which will be the lower diffusion layers 106a, 106b, or 106c as will be explained later). The side surface 8e is the side surface of the inter-layer insulating film 109b. The side surface 8f faces the side surface 8d and is the exposed side surface of the sidewall 15.

Accordingly, the contact portions 3a and 3b can be easily formed by filling the contact holes 31a and 31b with a conductive material film. The contact portions 3a and 3b are connected to the buried bit lines 105a and 105b via the bottom surfaces 8c of the contact holes 31a and 31b. Additionally, the contact portions 3a and 3b are connected to the semiconductor substrate 100 via the side surfaces 8d of the contact holes 31a and 31b. Since the side surfaces 8e and 9f are exposed side surfaces of the inter-layer insulating film 109b and the sidewall 15, respectively, each of the contact portions 3a and 3b is connected to only one lower diffusion layer in the semiconductor substrate 100.

Then, an impurity, such as arsenic or phosphorus, is introduced into a surface region of the semiconductor substrate 100 to form the bottom surface 81a of the word line trenches 8a. Preferably, an ion implantation method is used for introducing an impurity into the semiconductor substrate 100 to form the lower diffusion layers 106a, 106b, and 106c. When the ion implantation method is used, the impurity concentration of the lower diffusion layers 106a, 106b, and 106c decrease in the downward direction from the top portion thereof to the bottom portion thereof.

Preferably, an oblique ion implantation is used for introducing an impurity to form the lower diffusion layers 106a, 106b, and 106c. Preferably, the implantation angle is adjusted so as to approximate the perpendicular line to the side surface 8d of the contact hole 31a (31b) rather than the perpendicular line to the upper surface of the semiconductor substrate 100. In this case, the impurity concentration of the lower diffusion layers 106a, 106b, and 106c decreases from the top portion thereof to the bottom portion thereof. Further, the impurity concentration of the lower diffusion layers 106a, 106b, and 106c decreases from the side surface 8d toward the implantation direction. When the oblique ion implantation method is used, the impurity concentration of the side surface 8d is sufficiently high, thereby decreasing a connection resistance value between the contact portion 3a (3b) and the lower diffusion layer 106b (106c).

Then, a thin film, which is made of a titanium film or a cobalt film (not shown), is formed so as to cover inner surfaces of the contact holes 31a and 31b. Then, a thermal treatment process is carried out to grow titanium silicide or cobalt silicide from the side surface 8d of the contact holes 31a and 31b, which contacts the semiconductor substrate 100. Thereby, a connection resistance value between the lower diffusion layer 106b (106c) and the contact portion 3a (3b) can be decreased. Preferably, a cobalt silicide is formed to further decrease the resistance value.

Then, a conductive material for forming the contact portions 3a and 3b is provided by the CVD method into the contact holes 31a and 31b. Thus, a wiring material layer, which fills the contact hole 31a and 31b, is formed. For example, the wiring material layer is made of the same material as those of the buried bit lines 105a and 105b. Preferably, the wiring material layer is a multi-layered film including a titanium nitride film 19 covering an inner surface of the contact hole 31a (31b), and a tungsten film 20 covering the titanium nitride film 19 and filling the contact hole 31a (31b).

When the contact portions 3a and 3b are made of the same material as those of the buried bit lines 105a and 105b, the same apparatus can be used in the process of forming the contact portions 3a and 3b, and in the process of forming the buried bit lines 105a and 105b. Further, the number of materials required for manufacturing the semiconductor device of the first embodiment can be decreased, thereby enhancing the manufacturing efficiency.

Figure 18:
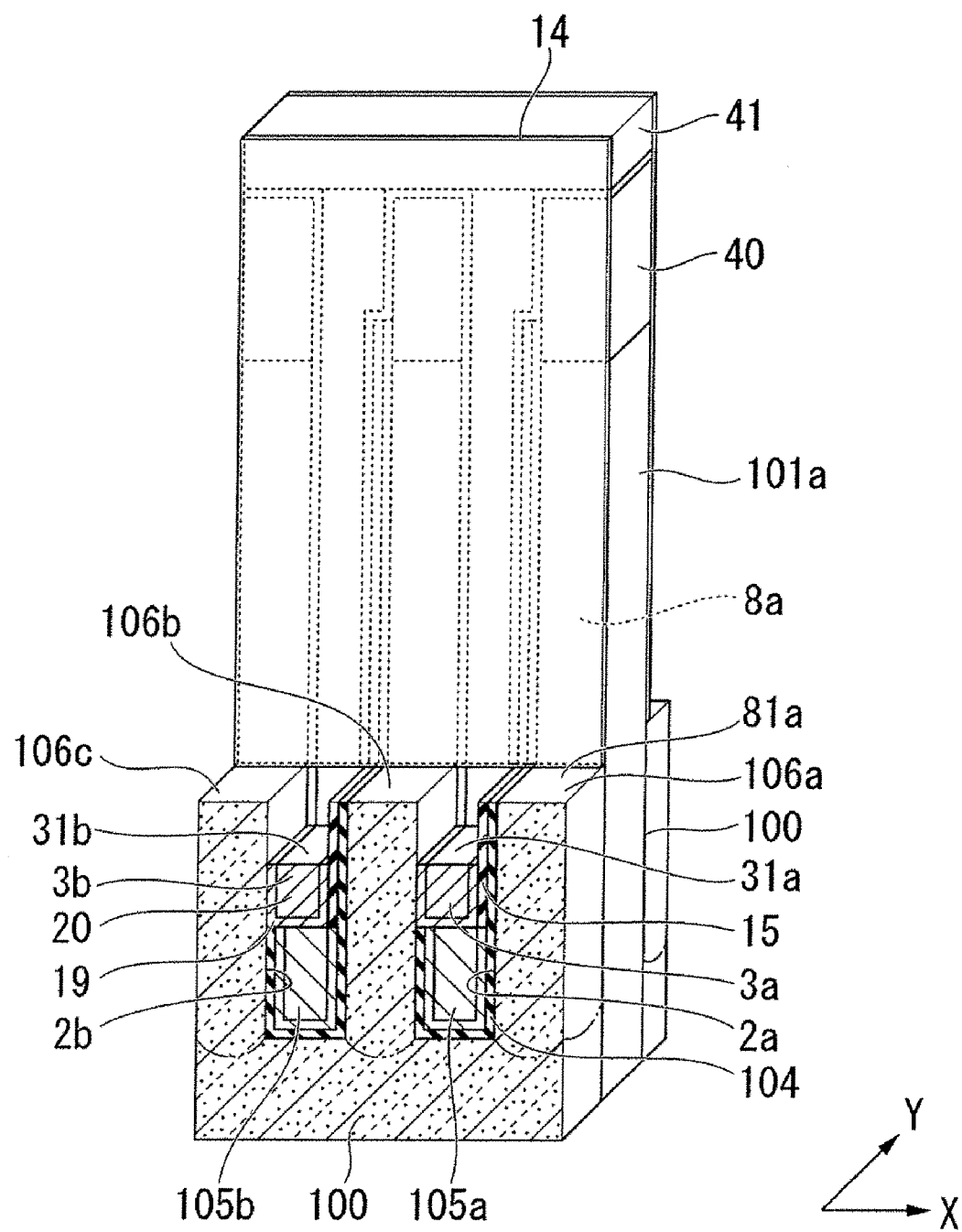

Then, the wiring material layer is anisotropically dry-etched down to the top level of the contact portions 3a and 3b. Thus, side surfaces of the lower diffusion layers 106a, 106b, and 106c are exposed. Thus, the contact portions 3a and 3b are formed so as to fill lower portions of the contact holes 31a and 31b, respectively, as shown in FIG. 18. The buried bit lines 105a and 105b are connected to the lower diffusion layers 106b and 106c via the contact portions 3a and 3b, respectively.

The connection area of the contact portion 3a (3b) and the lower diffusion layer 106b (106c) varies according to the vertical length of the contact portion 3a (3b). The vertical length of the contact portion 3a (3b) can be adjusted by adjusting the end point of the etching of the wiring material layer. In the first embodiment, the contact holes 31a and 31b are formed so as to extend downward from the bottom surface 81a of the word line trench 8a. Then, a conductive material is provided into the contact holes 31a and 31b to form the contact portions 3a and 3b. Accordingly, the contact portions 3a and 3b are lower in level than the bottom surface 81a of the word line trench 8a. Further, the contact portions 3a and 3b are insulated from each other. Therefore, the bottom surface 81a of the word line trench 8a (the top surfaces of the lower diffusion layers 106a, 106b, and 106c) can be used for detecting the end point of the etching of the wiring material layer.

There has been no means for detecting the end point of the etching in the case of the related art. For this reason, it has been difficult to control the position of the etched upper surface of the etched element, thereby causing a large variation in the end point. In the first embodiment, on the other hand, the silicon surface, which is the bottom surface 81a of the word line trench 8a, can be used for detecting the end point of the etching process, thereby enhancing the controllability of the etching process.

Accordingly, the connection area between the contact portion 3a (3b) and the lower diffusion layer 106b (106c) (the vertical length of the contact portions 3a and 3b) can be easily and precisely controlled by varying the distance between the bottom surface 81a of the word line trench 8a and the top surface of the buried bit line 105a (105b). Consequently, a semiconductor device, which achieves a very small variation in a connection resistance value between the buried bit line 105a (105b) and the lower diffusion layer 106b (106c), can be obtained.

Figure 28:
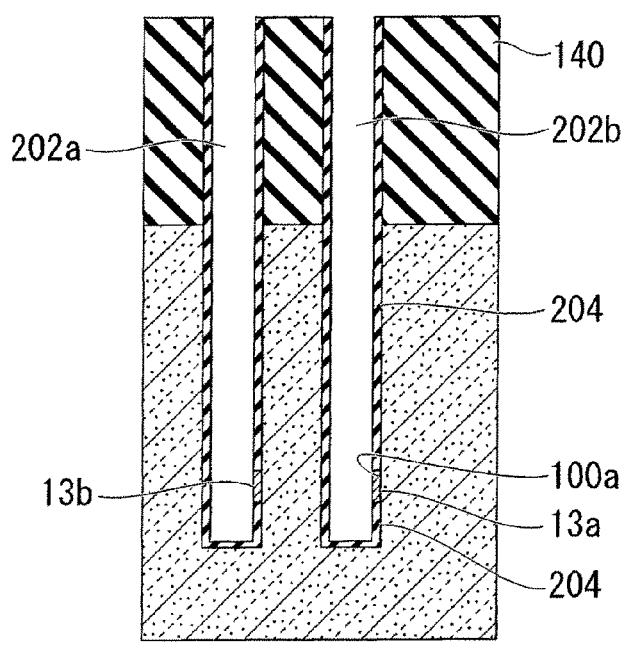
Figure 29:
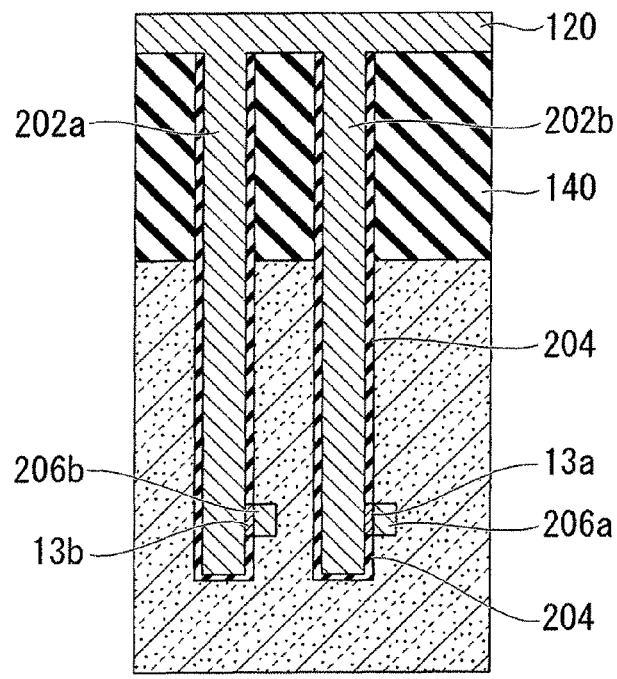
Figure 30:
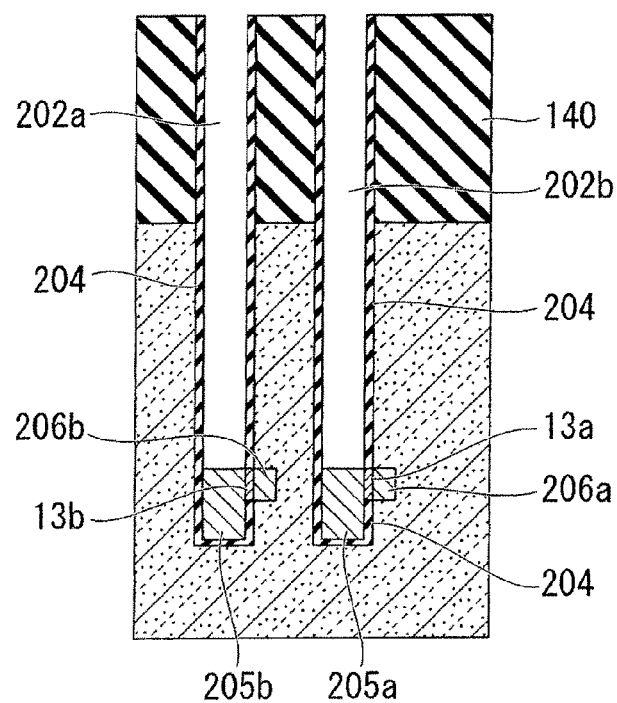

On the other hand, according to the method of the related art for forming a semiconductor device, which is shown in FIGS. 23 to 30, only part of the insulating film 204 is removed to form the hole 100a partially exposing the semiconductor substrate 200 to the trench 202a (202b). Then, the poly-silicon film 117 is formed so as to fill the trenches 202a and 202b. Then, the poly-silicon film 117 is etched so that only a portion of the poly-silicon film 117, which fills the hole 100a, remains. Thus, the contact portions 13a and 13b are formed as shown in FIG. 28. Then, a conductive film 120 is formed so as to fill the trenches 202a and 202b. Then, the conductive film 120 is etched down to the top level of the contact portions 13a and 13b. Thus, the buried bit lines 205a and 205b are formed as shown in FIG. 30.

In the case of the related art, variations in the shapes of the hole 100a and the contact portions 13a and 13b, and a variation in the vertical thicknesses of the buried bit lines 205a and 205b have been likely to become large. Thereby, a variation in a connection resistance value between the buried bit line 205a (205b) and the lower diffusion layer 206a (206b) has been large.

In the case of the first embodiment of the present invention, the process of forming the lower diffusion layers 106a, 106b, and 106c and the process of forming the contact portions 3a and 3b may be carried out after the process of forming the word line trenches 8a. Further, whichever of the process of forming the lower diffusion layers 106a, 106b, and 106c and the process of forming the contact portions 3a and 3b may be carried out first. Alternatively, as in the first embodiment of the present invention, the process of forming the lower diffusion layers 106a, 106b, and 106c may be carried out during the process of forming the contact portions 3a and 3b.

If the process of forming the lower diffusion layers 106a, 106b, and 106c are carried out before the process of etching the wiring material layer to form the contact portions 3a and 3b, the top surfaces of the lower diffusion layers 106a, 106b, and 106c can be used for detecting the end point of the etching of the wiring material layer. If the process of forming the lower diffusion layers 106a, 106b, and 106c is carried out after the process of etching the wiring material layer to form the contact portions 3a and 3b, the portions of the semiconductor substrate 100, which are exposed to the bottom surface 81a of the word line trench 8a, can be used for detecting the end point of the etching of the wiring material layer.

Figure 19:
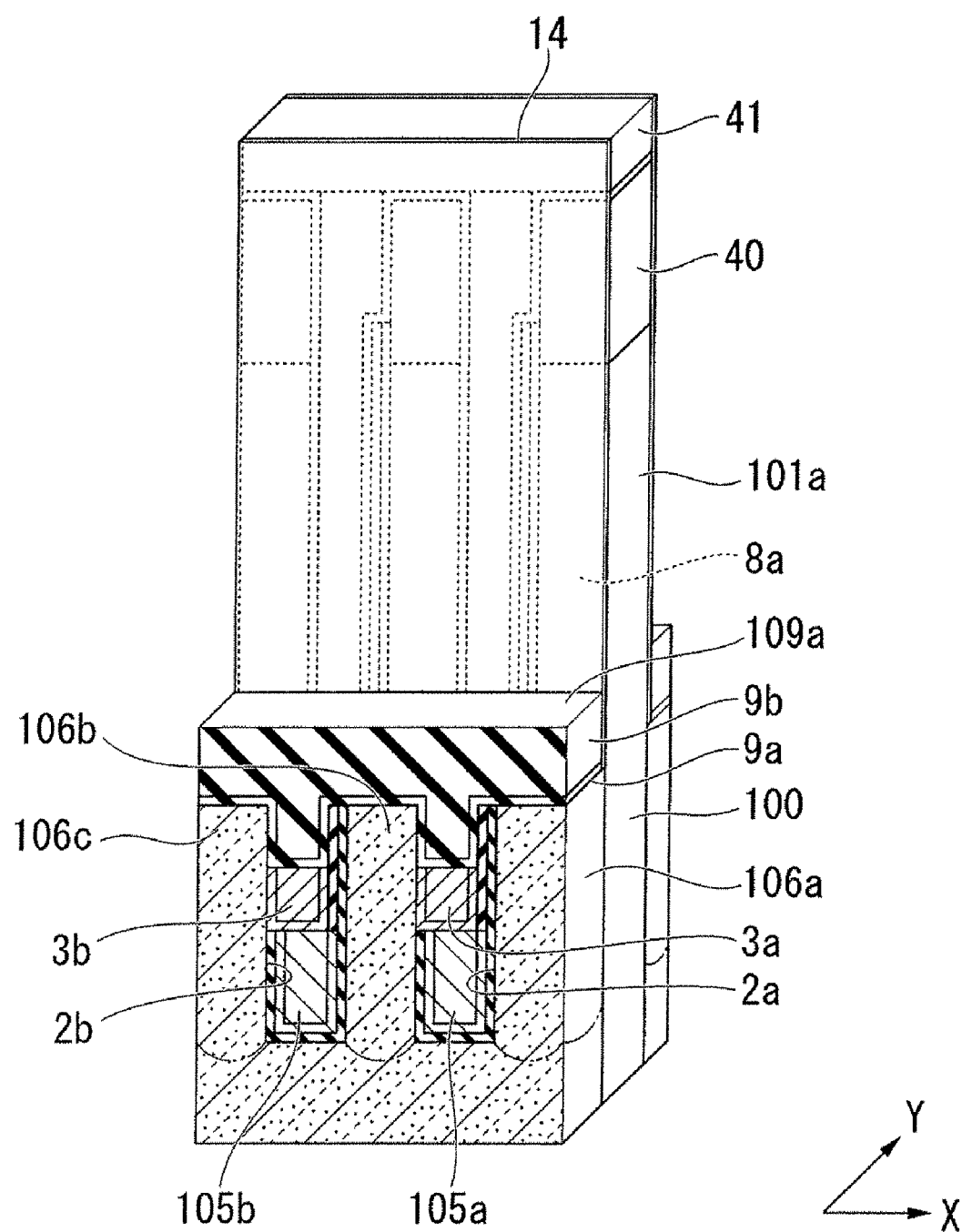

Then, a silicon oxynitride film 9a is formed by the CVD method so as to cover a bottom surface of the word line trench 8a. Then, a silicon oxide film 9b, which is made of an SOD material, is formed over the silicon oxynitride film 9a so as to fill a bottom portion of the word line trench 8a. Thus, the inter-layer insulating film (insulating film filling the word line trench) 109a, which includes the silicon oxynitride film 9a and the silicon oxide film 9b, is formed so as to fill the lower portion of the word line trench 8a and holes above the contact portions 3a and 3b, and to cover the lower diffusion layers 106a, 106b, and 106c, as shown in FIG. 19

Figure 20:
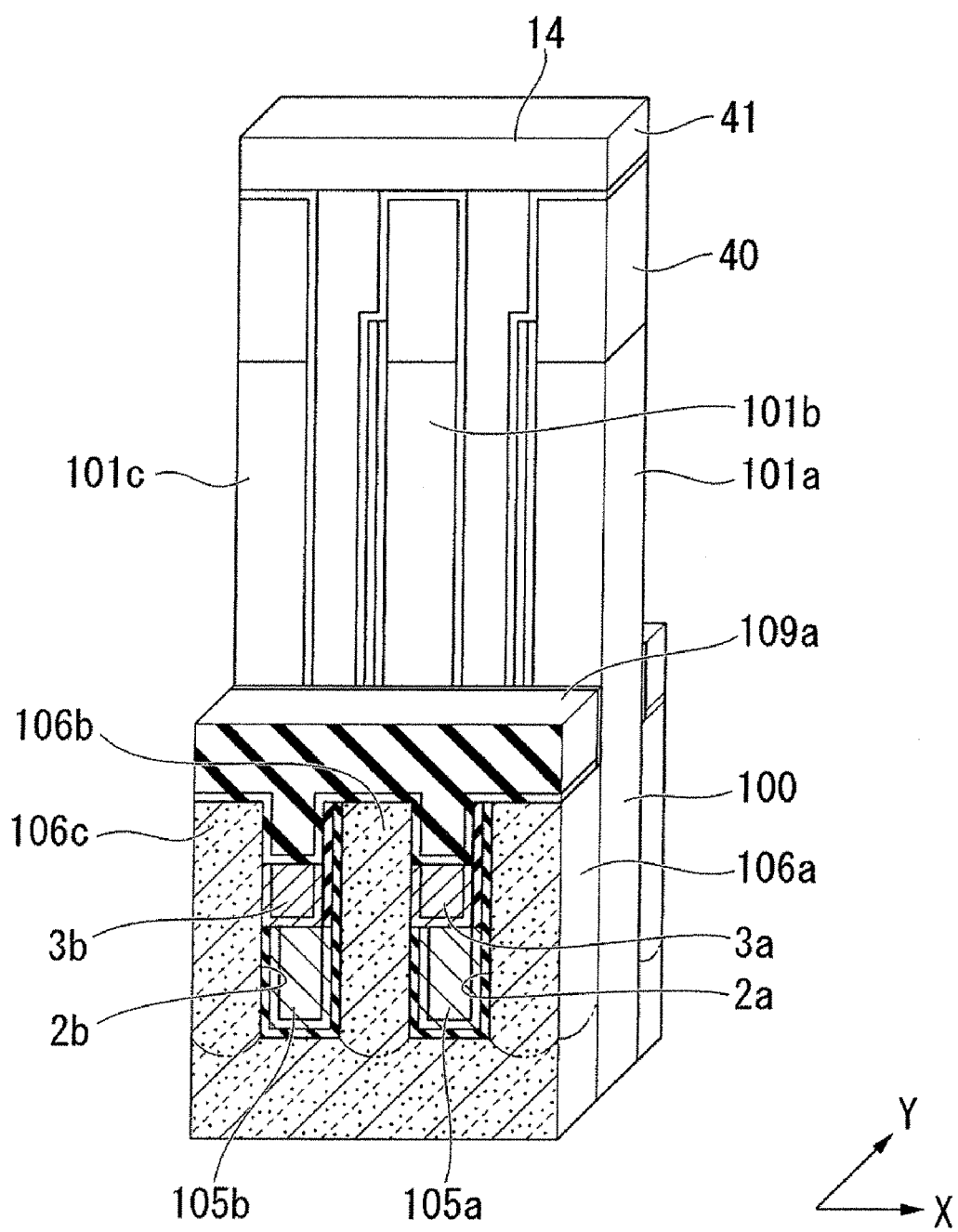
Figure 21:
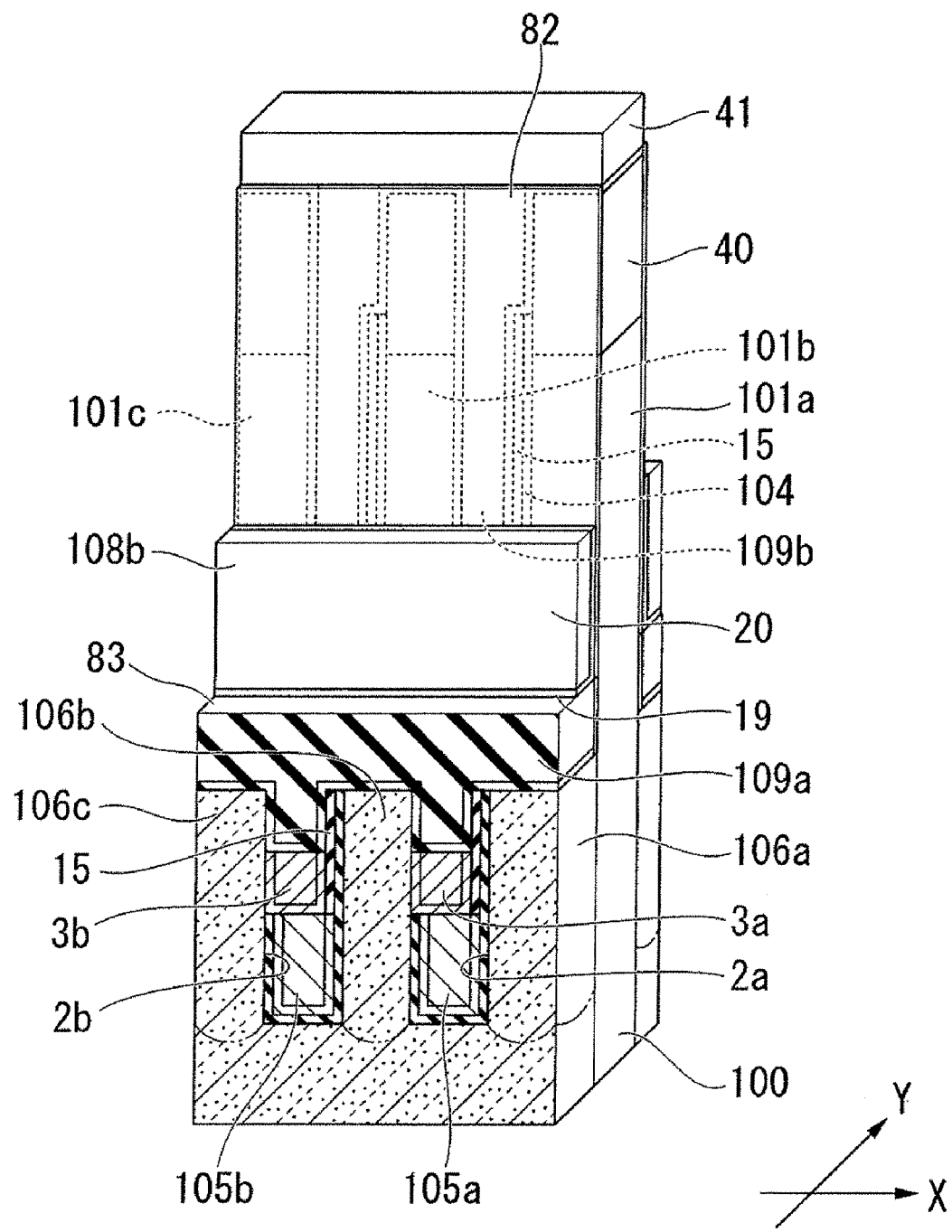
Figure 22:
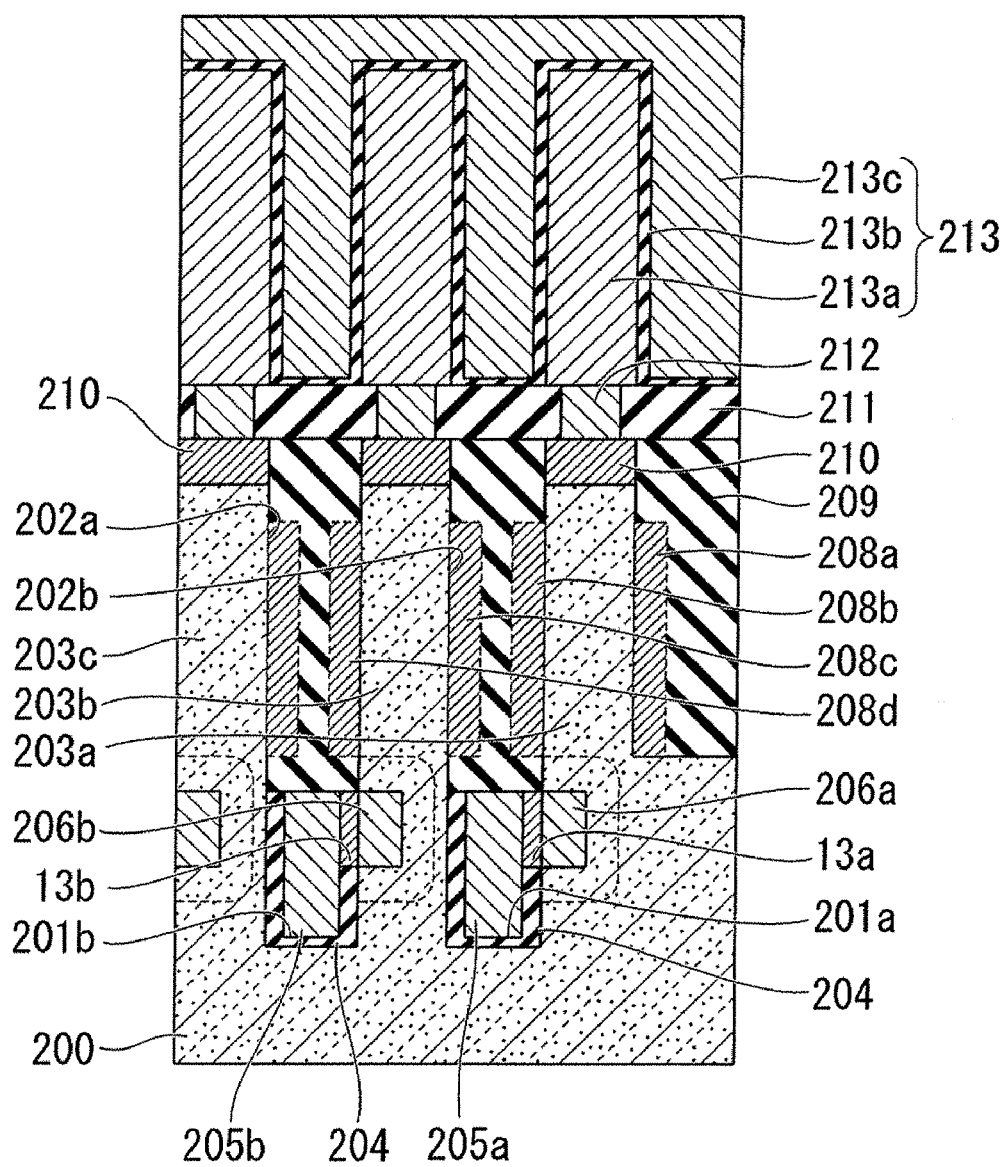
FIG. 22 is a cross-sectional view illustrating a DRAM exemplifying a semiconductor device of the related art.
Figure 23:
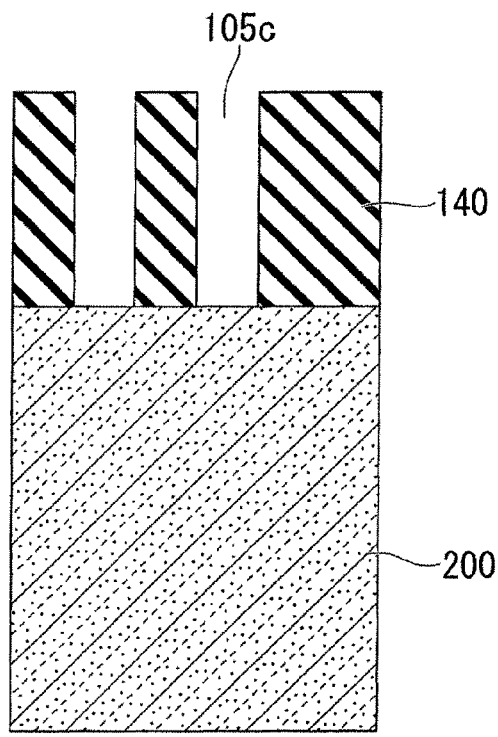
FIGS. 23 to 30 are cross-sectional views illustrating a process flow indicative of a method of the related art for manufacturing the DRAM shown in FIG. 22.
Figure 24:
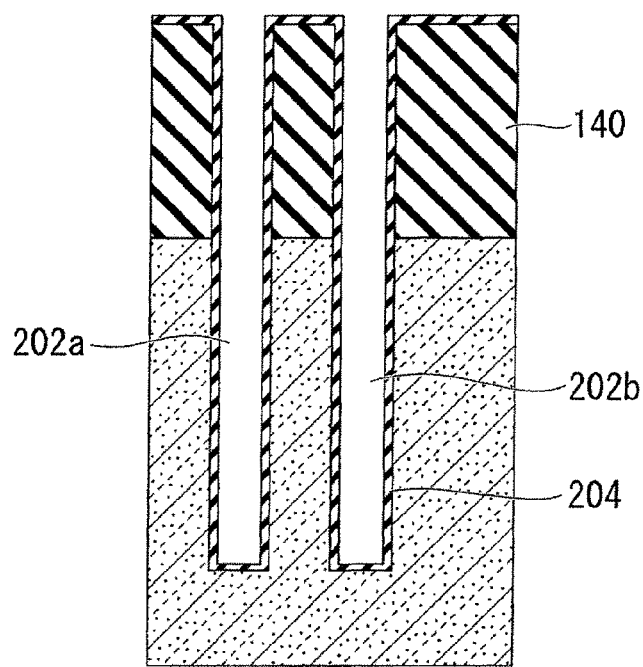
Figure 25:
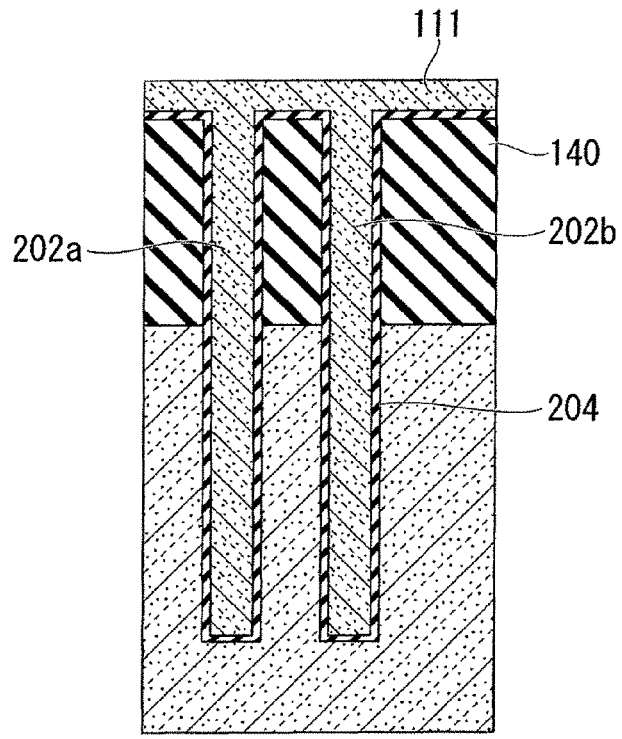
Figure 26:
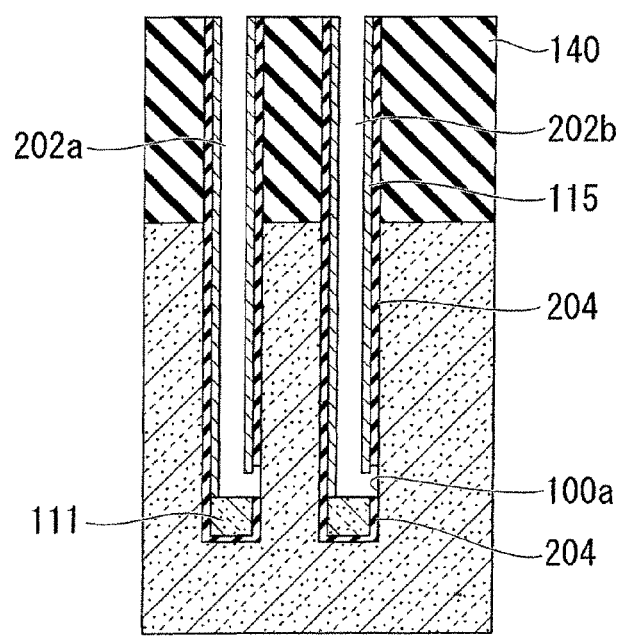
Figure 27:
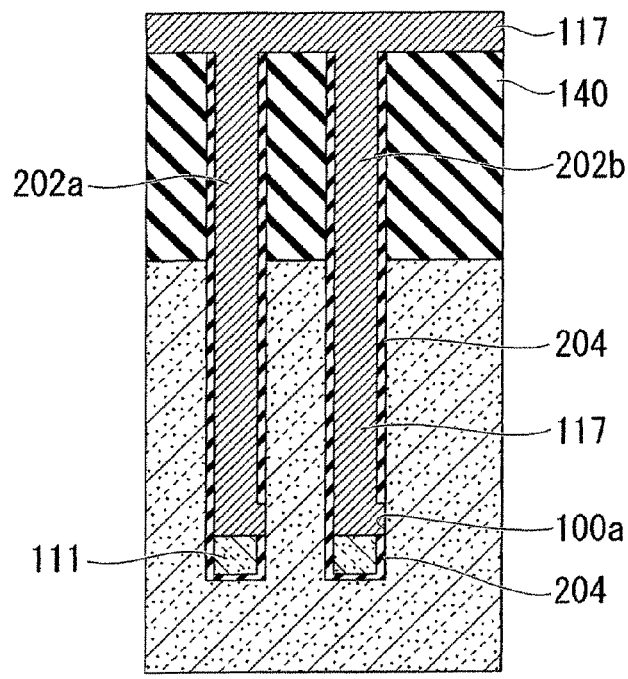

Then, the sidewall 14, which covers the side surfaces of the word line trench 8a, is removed by a dry-etching process to expose the silicon pillars 101a, 101b, and 101c to the word line trench 8a, as shown in FIG. 20. Then, a gate insulating film 82 is formed so as to cover the exposed side surfaces of the silicon pillars 101a, 101b, and 101c, as shown in FIG. 21.

Then, a conductive material for forming the gate electrode 108b is provided by the CVD method into the word line trench 8a to form a wiring material layer. For example, the wiring material layer is made of the same conductive material as those of the buried bit lines 105a and 105b. Preferably, the wiring material layer is made of a multi-layered film including the titanium nitride film 19 and the tungsten film 20. The titanium nitride film 19 covers the side surface of the gate insulating film 82 and the upper surface of the inter-layer insulating film 109a. The tungsten film 20 covers the titanium nitride film 19 and fills the word line trench 8a.

Then, part of the wiring material layer is removed by a dry-etching process or the like to form the isolation groove 83 in the substantially horizontal center of the word line trench 8a. The upper surface of the inter-layer insulating film 109a is partially exposed to the isolation groove 83. Thus, the gate electrodes 108b and 108c (the gate electrode 108c is not shown in FIG. 21) are formed on the inter-layer insulating film 109a, as shown in FIG. 21. The gate electrodes 108b and 108c are separated from each other by the isolation groove 83. Then, an inter-layer insulating film is formed so as to fill the isolation groove 83 and the word line trench 8a.

Then, the silicon oxide film 41 and the silicon nitride film 40, which are positioned over the semiconductor substrate 100, are removed by an etching process to expose the silicon pillars 101a to 103c. Then, the upper diffusion layers 110 are formed in the upper surface regions of the silicon pillars 101a to 103c, which are positioned higher in level than the gate electrodes 108a, 108b, 108c, and 108d. The upper diffusion layers 110 function as S/D regions as shown in FIGS. 1 and 3B.

Then, a process of forming the contact plug 112 over the upper diffusion layer 110 and a process of forming the capacitor 113 over the contact plug 112 are carried out. Thus, the semiconductor memory device shown in FIGS. 1 to 3 can be obtained.

As explained above, the method of manufacturing a semiconductor device according to the first embodiment of the present invention includes: the process of forming the buried bit lines 105a and 105b so as to fill bottom portions of the bit line trenches 2a and 2b extending in the Y-direction, the inner surfaces of the bit line trenches 2a and 2b being covered by the insulating film 104; the process of forming the word line trench 8a extending in the X-direction and having the bottom surface 81a that exposes part of the semiconductor substrate 100 and is higher in level than the upper surfaces 105d of the buried bit lines 105a and 105b; the process of diffusing an impurity into the portions of the semiconductor substrate 100 which are exposed to the bottom surface 81a of the word line trench 8a, to form the lower diffusion layers 106a, 106b, and 106c; and the process of forming the contact portions 3a and 3b that connect the buried bit lines 105a and 105b and the lower diffusion layers 106b and 106c, respectively.

Accordingly, an ion implantation method can be used as a method of diffusing an impurity into the semiconductor substrate 100 to form the lower diffusion layers 106a, 106b, and 106c. The ion implantation method enables easier and more precise control of the dose amount of an impurity than the thermal diffusion method of the related art, in which a thermal treatment process is carried out to diffuse an impurity included in the contact portion. Therefore, a semiconductor device, which achieves a small variation in a resistance value of the lower diffusion layers 106a, 106b, and 106c, and the higher reliability, can be easily provided.

Additionally, the thermal diffusion method of the related art is not used in the first embodiment of the present invention to introduce an impurity into the semiconductor substrate 100 to form the lower diffusion layers 106a, 106b, and 106c. Accordingly, a material containing an impurity, which is necessary for the thermal treatment method, need not be used as a material for forming the contact portions 3a and 3b, in the first embodiment of the present invention. For this reason, the manufacturing method of the first embodiment of the present invention has a high degree of freedom of a material to be used for forming the contact portions 3a and 3b. Therefore, the contact portions 3a and 3b can be made of a material ensuring more safety and more excellent conductivity than in the case of carrying out the thermal diffusion method.

Specifically, for example, an arsenic-doped silicon film is used in the related art to form an impurity diffusion layer by a thermal diffusion method. However, an extremely-poisonous arsine ($AsH_3$) gas is used for forming the arsenic-doped silicon film, thereby causing high costs for ensuring safety at the time of use. On the other hand, an arsenic-ion implantation ensuring safety can be used in the first embodiment of the present invention, thereby achieving safety and low costs.

Further, according to the manufacturing method of the first embodiment, the process of forming the contact portions 3a and 3b is carried out after the process of forming the buried bit lines 105a and 105b filling the bottom portions of the bit line trenches 2a and 2b having inner surfaces covered by the insulating film 104. For this reason, the contact portions 3a and 3b can be formed while the buried bit lines 105a and 105b cover the bottom portions of the insulating film 104. Thereby, the bottom portions of the insulating film 104 can be prevented from being damaged. Therefore, short-circuit between the buried bit line 105a (105b) and the semiconductor substrate 100, which is caused by the damage of the bottom portions of the insulating film 104, can be prevented. Additionally, short-circuit between adjacent buried bit lines can be prevented.

Figure 31:
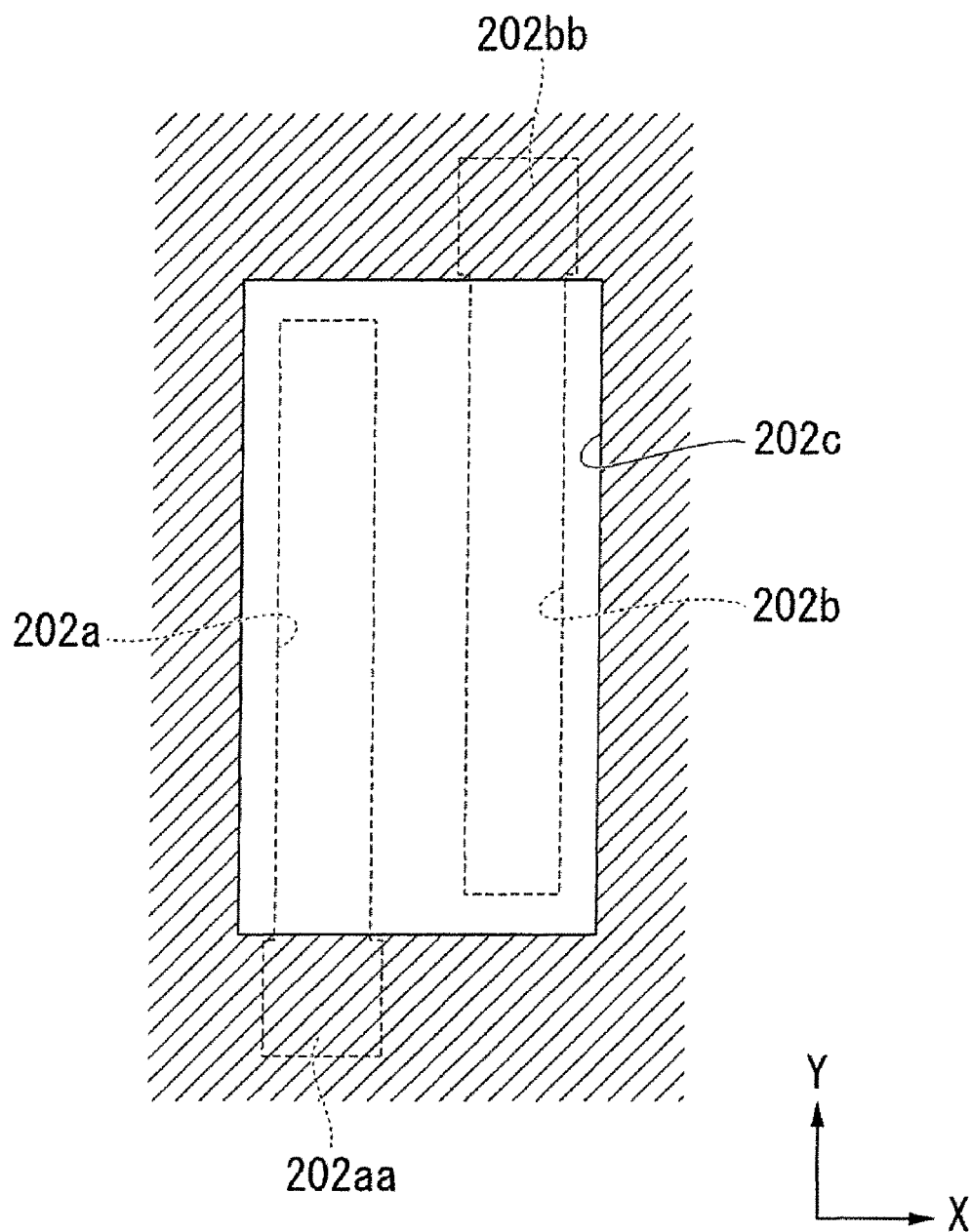
FIG. 31 is a plan view illustrating one process included in the method of the related art for manufacturing the DRAM shown in FIG. 22.

Moreover, according to the manufacturing method of the first embodiment, the lower diffusion layers 106a, 106b, and 106c are formed under the word line trench 8a, only in a portion of the memory cell region where the pillar transistors are formed, and not in bit-line-pulling contact portion. For this reason, the lithography process, which has been required in the related art for covering the bit-line-pulling contact portion shown in FIG. 31, can be omitted in the first embodiment of the present invention.

Additionally, the process of forming and removing multiple sidewalls and the process of forming and etching multiple buried films, which have been required in the related art, can be omitted in the first embodiment of the present invention. Thereby, manufacturing processes can be significantly simplified, thereby increasing the manufacturing yield and reducing manufacturing costs.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

In addition, while not specifically claimed in the claim section, the application reserves the right to include in the claim section at any appropriate time the following semiconductor method.

A method of manufacturing a semiconductor device may include, but is not limited to the following processes. A first groove is formed in a semiconductor substrate. The first groove extends in a first horizontal direction. A first insulating film, which covers an inner surface of at least a lower portion of the first groove, is formed. A bit line is formed in the lower portion of the first groove. The bit line is insulated from the semiconductor substrate by the first insulating film. A second groove is formed in the semiconductor substrate. The second groove extends in a second horizontal direction different from the first direction. The bottom level of the second groove is higher than the bottom level of the first groove. A first diffusion layer containing a first impurity is formed in the semiconductor substrate. The first diffusion layer is adjacent to the first groove and a bottom surface of the second groove. A contact portion is formed in the first groove over the bit line. The contact portion connects the bit line and the first diffusion layer.

Regarding the above method, forming the first diffusion layer is performed by an ion implantation method.

Regarding the above method, forming the contact portion comprises forming the contact portion under the second groove.

The above method further includes the following processes. After the first diffusion layer and the contact portion are formed, a second insulating film is formed over the contact portion so as to fill a lower portion of the second groove. A word line is formed over the second insulating film. The word line is adjacent to a side surface of the second groove.

Regarding the above method, the process of forming the contact portion includes the following processes. A contact hole extending downward from a bottom surface of the second groove is formed. The contact hole exposes an upper surface of the bit line. A conductive film filling the contact hole is formed.

Regarding the above method, the first groove has at least first and second side surfaces facing each other in the second direction. The method further includes the following processes. After the bit line is formed, before the second groove is formed, a sidewall is formed over the bit line. The sidewall covers an upper portion of the first side surface of the first groove. The process of forming the contact hole includes a process of forming the contact hole exposing the upper surface of the bit line, the sidewall, and a part of the second side surface.

What is claimed is:

1. A semiconductor device comprising:
   a semiconductor substrate having a first surface and a first groove extending downward from the first surface, the first groove extending in a first horizontal direction, and the first groove having at least first and second side surfaces facing each other;
   a first semiconductor portion extending upward from the first surface of the semiconductor substrate, the first semiconductor portion being adjacent to the first side surface of the first groove in plan view;
   a second semiconductor portion extending upward from the first surface of the semiconductor substrate, the second semiconductor portion being adjacent to the second side surface of the first groove in plan view, and the first and second semiconductor portions being arranged in a second horizontal direction different from the first horizontal direction;
   a bit line in the first groove, the bit line being insulated from the semiconductor substrate; and
   a contact portion in the first groove, the contact portion being electrically connected to the bit line, the contact portion contacting the first side surface of the first groove, and the contact portion being insulated from the second side surface of the first groove.

2. The semiconductor device according to claim 1, further comprising:
   a first insulating film covering the first surface of the semiconductor substrate, the first insulating film filling up the first groove; and
   a pair of word lines over the first insulating film, the pair of word lines extending in the second horizontal direction, the first and second semiconductor portions being positioned between the pair of the word lines, and the pair of word lines partially overlapping the contact portion in plan view.

3. The semiconductor device according to claim 1, further comprising:
   a second insulating film covering a bottom surface of the first groove, at least a part of the second side surface of the first groove, and a lower part of the first side surface of the first groove, the second insulating film insulating the bit line from the semiconductor substrate;
   a first diffusion region in the semiconductor substrate, the first diffusion region containing a first impurity, the first diffusion region being adjacent to the first surface of the semiconductor substrate and the first side surface of the first groove, and the first diffusion region being adjacent to the first semiconductor portion in plan view; and
   a second diffusion region in the semiconductor substrate, the second diffusion region containing a second impurity,
   the second diffusion region being adjacent to the first surface of the semiconductor substrate and the second side surface of the first groove, and the second diffusion region being adjacent to the second semiconductor portion in plan view, wherein the contact portion connects the first diffusion region and the bit line, and the second insulating film insulates the contact portion from the second diffusion region.

4. The semiconductor device according to claim 3, further comprising:

a third diffusion region in a top region of the first semiconductor portion, the third diffusion region containing a third impurity; and a fourth diffusion region in a top region of the second semiconductor portion, the fourth diffusion region containing a fourth impurity, and the third and fourth impurities differ in a conductivity type from the first and second impurities.

* * * * *